United States Patent
Ozawa

(10) Patent No.: US 7,750,391 B2
(45) Date of Patent: Jul. 6, 2010

(54) SEMICONDUCTOR DEVICE AND METHOD FOR MANUFACTURING THE SAME

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 480 days.

(21) Appl. No.: 11/723,029

(22) Filed: Mar. 16, 2007

(65) Prior Publication Data

US 2007/0228447 A1   Oct. 4, 2007

(30) Foreign Application Priority Data

Mar. 31, 2006 (JP) ............... 2006-097538
Nov. 2, 2006 (JP) ............... 2006-299202

(51) Int. Cl.
*H01L 29/76* (2006.01)
(52) U.S. Cl. ............... 257/314; 257/315; 257/324; 257/501
(58) Field of Classification Search ........... 257/314, 257/315, 324, 501
See application file for complete search history.

(56) References Cited

U.S. PATENT DOCUMENTS

2006/0214215 A1 *   9/2006   Lee ..................... 257/314

FOREIGN PATENT DOCUMENTS

| JP | 06268234 | * | 9/1994 |
| JP | 2001-267539 | | 9/2001 |
| JP | 2002-261097 | | 9/2002 |
| JP | 2002-289709 | | 10/2002 |

* cited by examiner

*Primary Examiner*—Long Pham
(74) *Attorney, Agent, or Firm*—Finnegan, Henderson, Farabow, Garrett & Dunner, L.L.P.

(57) ABSTRACT

A semiconductor device including a semiconductor substrate, a tunnel insulation film provided on the surface of the semiconductor substrate, charge trap states at which an electron potential energy is higher than a Fermi level of the semiconductor substrate being provided at part of the tunnel insulation film at least in the vicinity of an interface with the semiconductor substrate, and at least one charge storage layer being provided on the tunnel insulation film, charges supplied from the semiconductor substrate via the tunnel insulation film being accumulated in the charge storage layer.

8 Claims, 13 Drawing Sheets

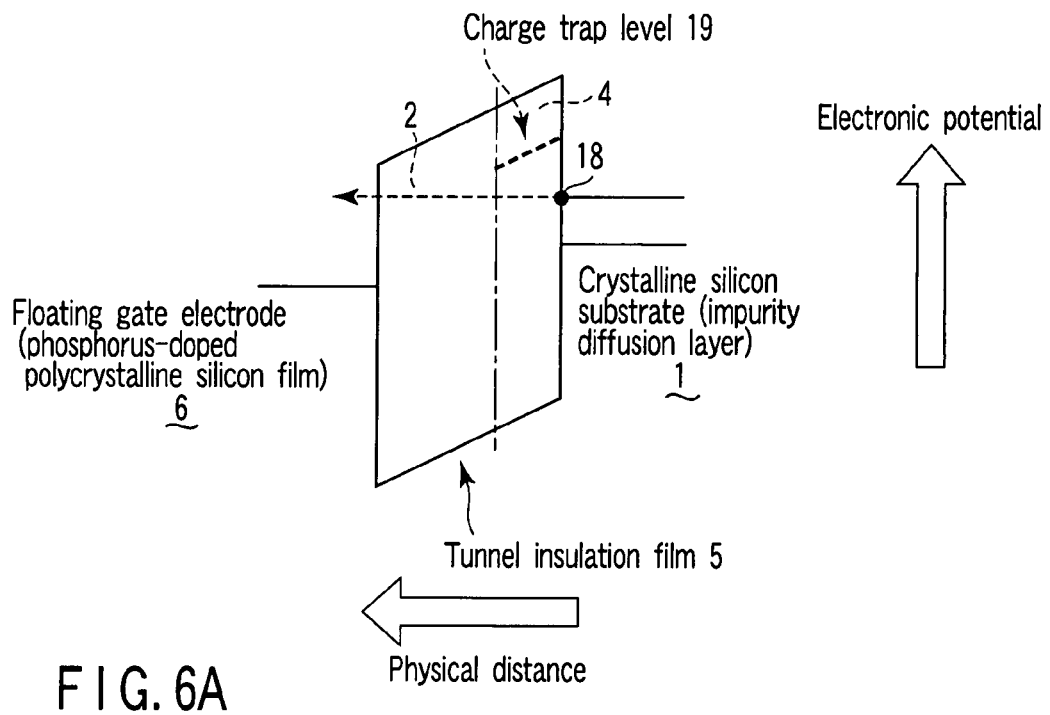
F I G. 6A
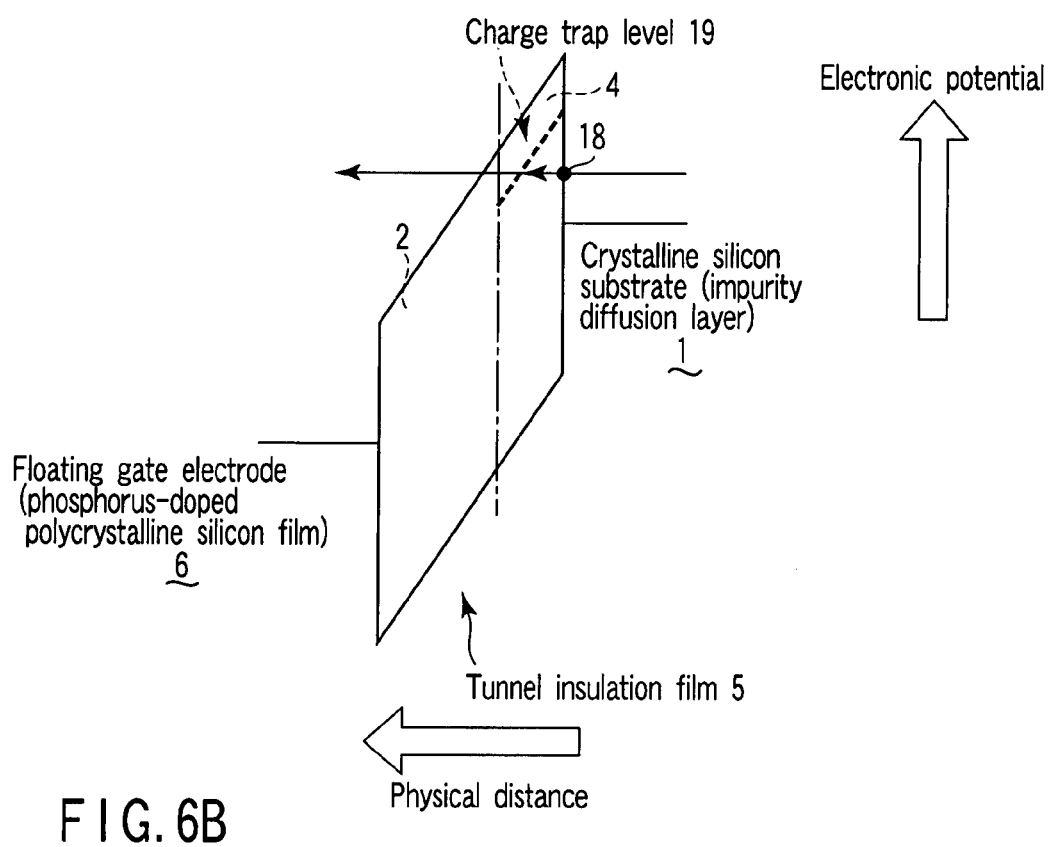
F I G. 6B

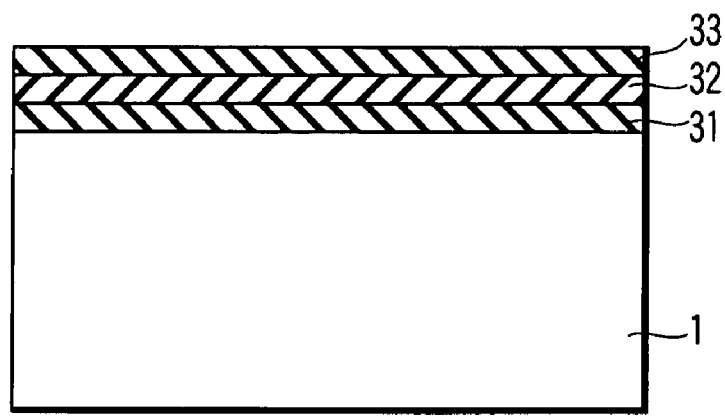
F I G. 8A
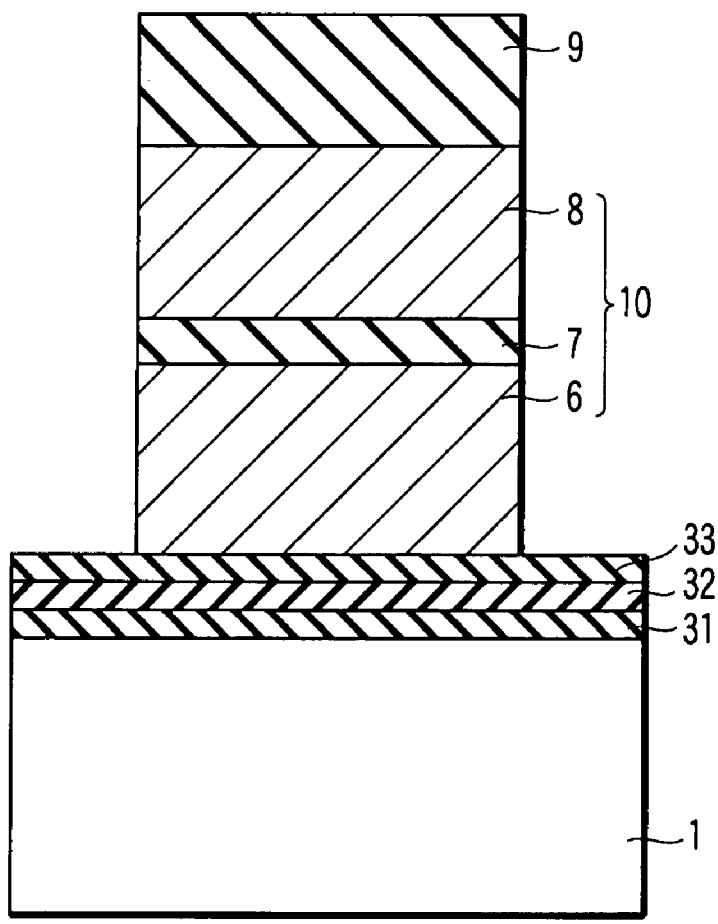
F I G. 8B

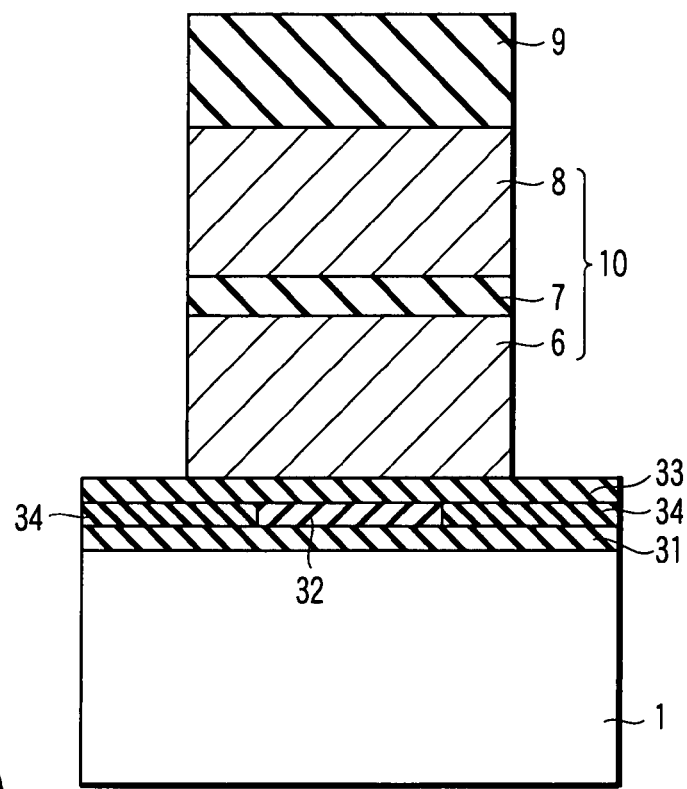
F I G. 9A
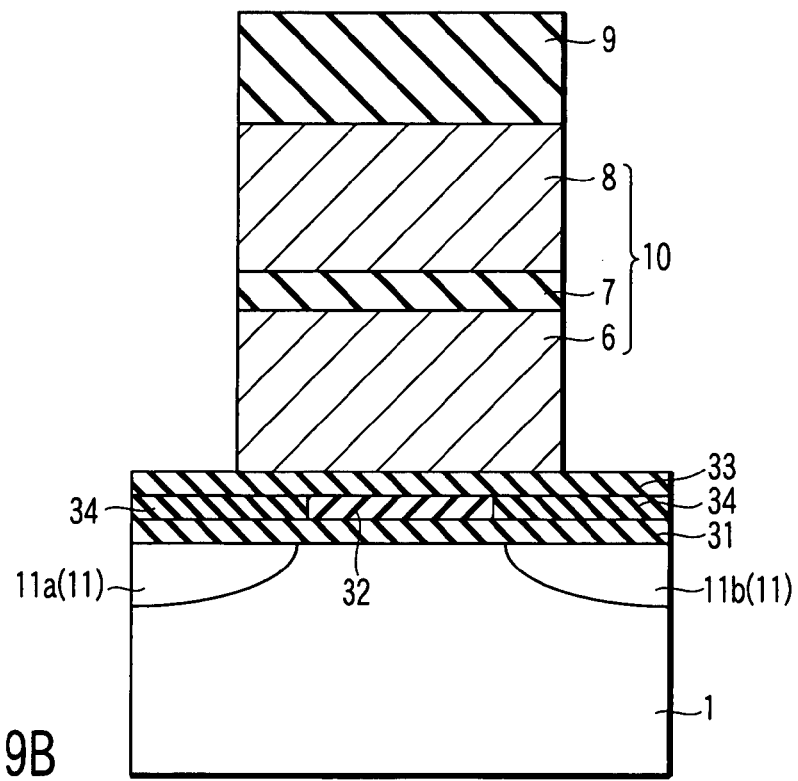
F I G. 9B

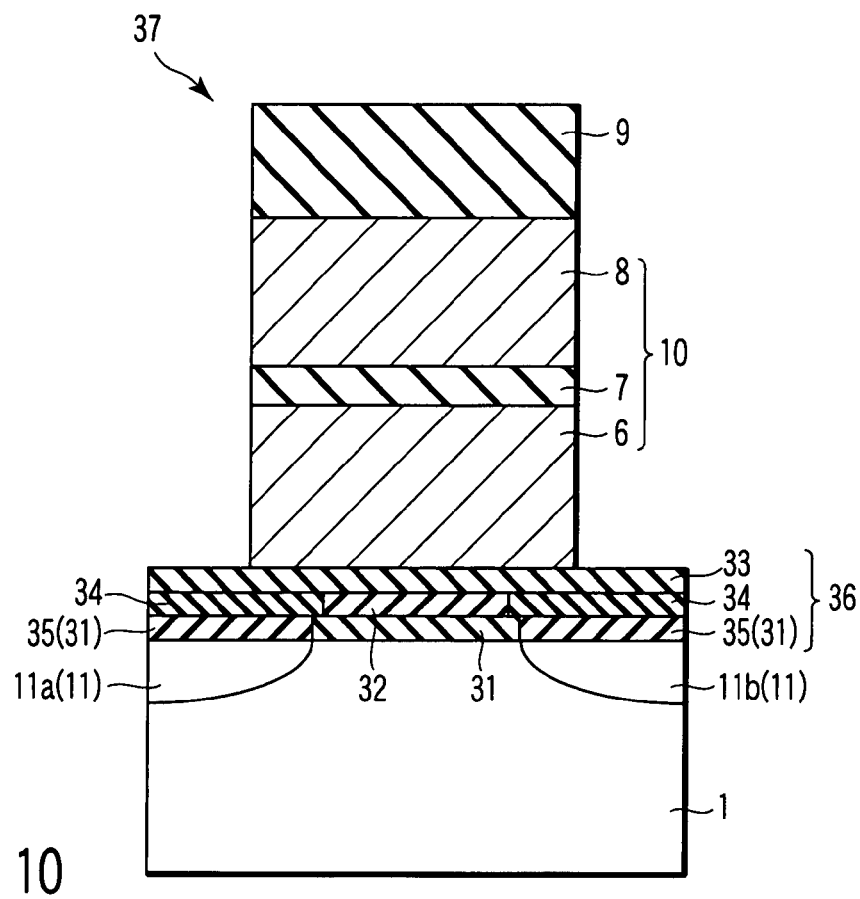
F I G. 10
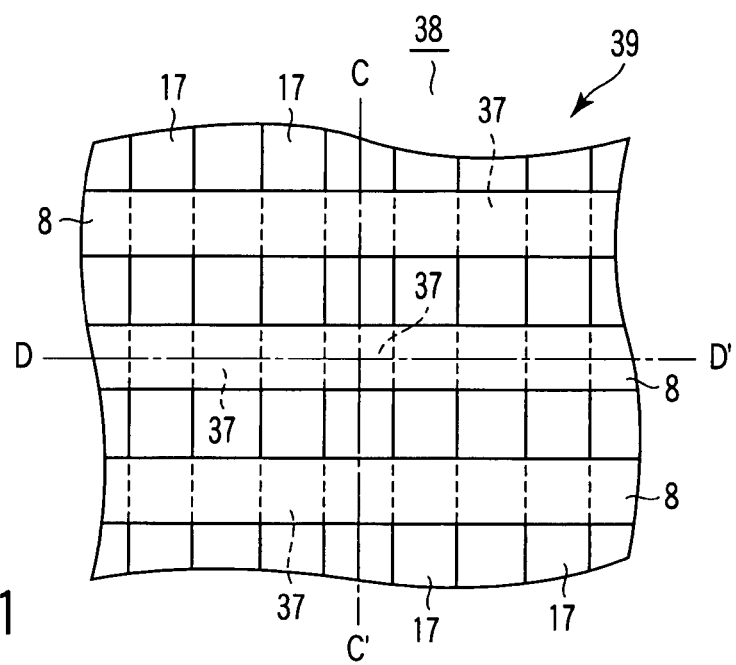
F I G. 11

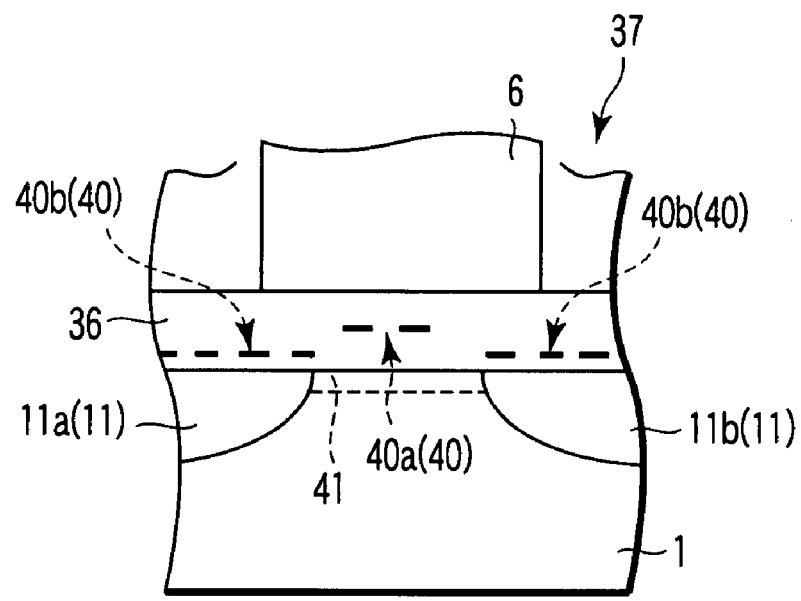
F I G. 14A
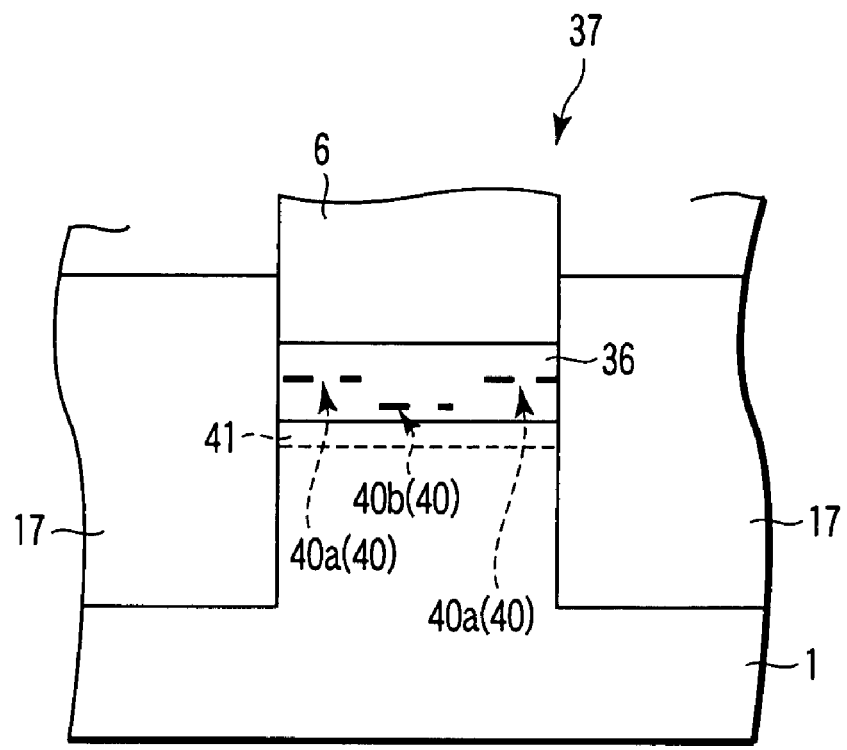
F I G. 14B

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Applications No. 2006-097538, filed Mar. 31, 2006; and No. 2006-299202, filed Nov. 2, 2006, the entire contents of both of which are incorporated herein by reference.

BACKGROUND OF THE INVENTION

1. Field of the Invention

The present invention relates to a semiconductor apparatus equipped with a memory element and a method for manufacturing the same. In particular, the present invention relates to a semiconductor device equipped with a memory element having its improved electrical characteristics and a method for manufacturing the same.

2. Description of the Related Art

Among semiconductor devices, there is a memory type semiconductor device called a flash memory. As described in Jpn. Pat. Appln. KOKAI Publication No. 2002-261097, a memory element (memory cell) in a flash memory generally has a structure described below.

A source region and a drain region composed of impurity diffusion layers are provided at the top layer portion of a semiconductor substrate. A tunnel insulation film is provided on the surface of the semiconductor substrate while covering these source region and drain region. In addition, provided on the tunnel insulation film is a stacked gate structure including a floating gate electrode, an inter-electrode insulation film, and a control gate electrode. The stacked gate structure (floating gate electrode) is provided above an intermediate portion of the source region and the drain regions so as to be sandwiched therebetween.

Electrons or positive holes are accumulated on the floating gate electrode, and then, a threshold voltage of a transistor thereof is varied, whereby the memory cell is set in an electrically different state. In this manner, the memory cell develops a memory function. In order to accumulate electrons or positive holes on the floating gate electrode, a high voltage is applied to the control gate electrode to apply a high electric field to the tunnel insulation film. As a result, a tunnel current flows in the tunnel insulation film, so that electrons or positive holes are accumulated on the floating gate electrode.

In general, an insulation film with a high barrier height is used for the tunnel insulation film, for example, as is a silicon oxide film or a silicon oxynitride film. Specifically, it is general that an insulation film whose barrier height is equal to or greater than 3 eV is used. This is because, when data is maintained in the memory cell or when memory cell data is read, a tunnel current is precluded from flowing in the tunnel insulation film in a weak electric field applied to the tunnel insulation film. Specifically, this is because the tunnel current is precluded from flowing in the tunnel insulation film when the intensity of the electric field applied to the tunnel insulation film is equal to or smaller than about 5 MV/cm.

However, if the insulation film with its high barrier height described previously is used for the tunnel insulation film, the tunnel current hardly flows in the tunnel insulation film when data is written into the memory cell or when a strong electric field is applied to the tunnel insulation film in order to erase data contained in the memory cell. Specifically, even if the intensity of the electric field applied to the tunnel insulation film is equal to or greater than about 10 MV/cm, the tunnel current hardly flows in the tunnel insulation film. As a result, the time for writing data into the memory cell or an erase time has become lengthened.

In order to overcome such a problem, up to now, a high voltage has been applied to the control gate electrode. However, as downsizing of the memory cell or the like advances, a withstand voltage failure or the like of the tunnel insulation film responsive to a high voltage is more likely to occur. Specifically, in a memory cell fabricated under a design that is approximately 100 nm or smaller, it has been impossible to overcome the problem such as the withstand voltage failure of the tunnel insulation film.

BRIEF SUMMARY OF THE INVENTION

According to an aspect of the invention, there is provided a semiconductor device comprising: a semiconductor substrate; a tunnel insulation film provided on the surface of the semiconductor substrate, charge trap states at which an electron potential energy is higher than a Fermi level of the semiconductor substrate being provided at part of the tunnel insulation film at least in the vicinity of an interface with the semiconductor substrate; and at least one charge storage layer being provided on the tunnel insulation film, charges supplied from the semiconductor substrate via the tunnel insulation film being accumulated in the charge storage layer.

According to another aspect of the invention, there is provided a semiconductor device comprising: a semiconductor substrate, an impurity diffusion layer being formed at the top layer portion of the semiconductor substrate; a tunnel insulation layer provided on the surface of the semiconductor substrate, charge trap states at which an electron potential energy is higher than a Fermi level of the semiconductor substrate being provided at part of the tunnel insulation film; and at least one charge storage layer provided on the tunnel insulation film, a charge supplied from the semiconductor substrate via the tunnel insulation film being accumulated in the charge storage layer, wherein the charge trap states are provided in a region that covers at least part of the impurity diffusion layer at least in the vicinity of an interface of the tunnel insulation film with the semiconductor substrate, and further, is provided below the charge storage layer and at an intermediate portion in a film thickness direction of the tunnel insulation film.

According to a further aspect of the invention, there is provided a semiconductor device comprising: a semiconductor substrate, a plurality of element isolation regions being formed at the top layer portion of the semiconductor substrate; a tunnel insulation film provided on the surface of the semiconductor substrate sandwiched between the element isolation regions adjacent to each other, charge trap states at which an electron potential energy is higher than a Fermi level of the semiconductor substrate being provided at part of the tunnel insulation film; and at least one charge storage layer provided to be sandwiched between the element isolation regions adjacent to each other on the tunnel insulation film, a charge supplied from the semiconductor substrate being accumulated on the charge storage layer via the tunnel insulation film, wherein the charge trap states are provided in a region other than the vicinity of the element isolation region at least in the vicinity of an interface of the tunnel insulation film with the semiconductor substrate, and further, are provided in the vicinity of the element isolation region and at an intermediate portion in a film thickness direction of the tunnel insulation film.

According to another aspect of the invention, there is provided a method for manufacturing a semiconductor device, comprising: providing a tunnel insulation film while covering the surface of a semiconductor substrate; providing charge trap states at which an electron potential energy is higher than a Fermi level of the semiconductor substrate at part of the tunnel insulation film at least in the vicinity of an interface with the semiconductor substrate; providing at least one charge storage layer on the tunnel insulation film; and forming an impurity diffusion layer which supplies to the charge storage layer charges via the tunnel insulation film at the top layer portion of the semiconductor substrate.

BRIEF DESCRIPTION OF THE SEVERAL VIEWS OF THE DRAWINGS

FIGS. 6A and 6B are views schematically showing an energy band diagram of a tunnel insulation film possessed by the semiconductor device according to the first embodiment;

FIGS. 8A and 8B are process sectional views showing a method for manufacturing a semiconductor device according to a second embodiment;

FIGS. 9A and 9B are process sectional views showing the method for manufacturing the semiconductor device according to the second embodiment;

FIG. 10 is a process sectional view showing the method for manufacturing the semiconductor device according to the second embodiment;

FIG. 11 is a plan view showing a memory element forming region of the semiconductor device according to the second embodiment as seen from above thereof;

FIG. 14A is a sectional view showing a spatial distribution of charge trap states of a tunnel insulation film possessed by the semiconductor device according to the second embodiment; and FIG. 14B is a sectional view showing a spatial distribution of charge trap states of a tunnel insulation film possessed by a semiconductor device according to a modified example of the second embodiment.

DETAILED DESCRIPTION OF THE INVENTION

Now, embodiments according to the present invention will be described with reference to the accompanying drawings.

First Embodiment

Figure 3:
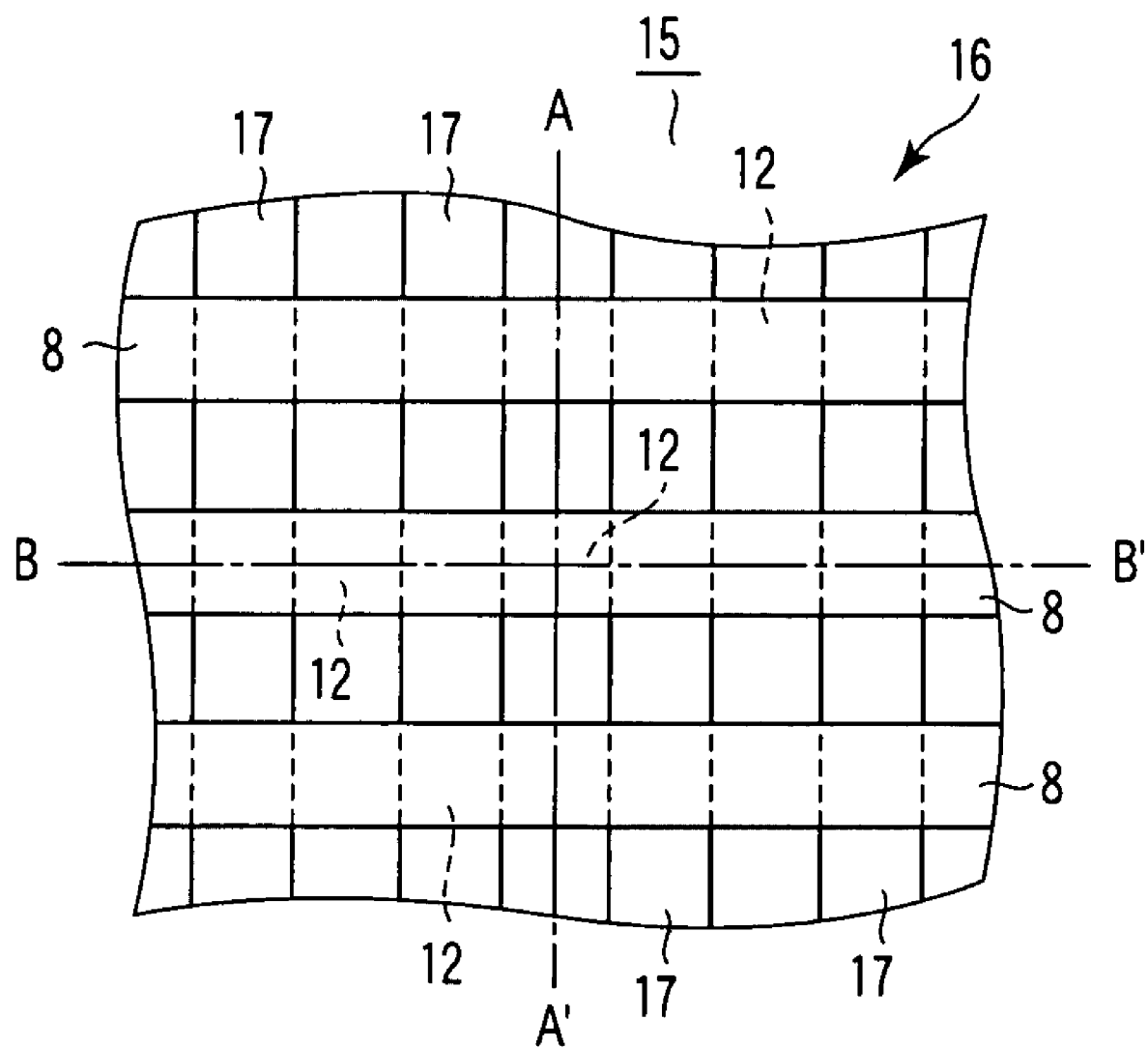
FIG. 3 is a plan view showing a memory element forming region of the semiconductor device according to the first embodiment as seen from above thereof.
Figure 4:
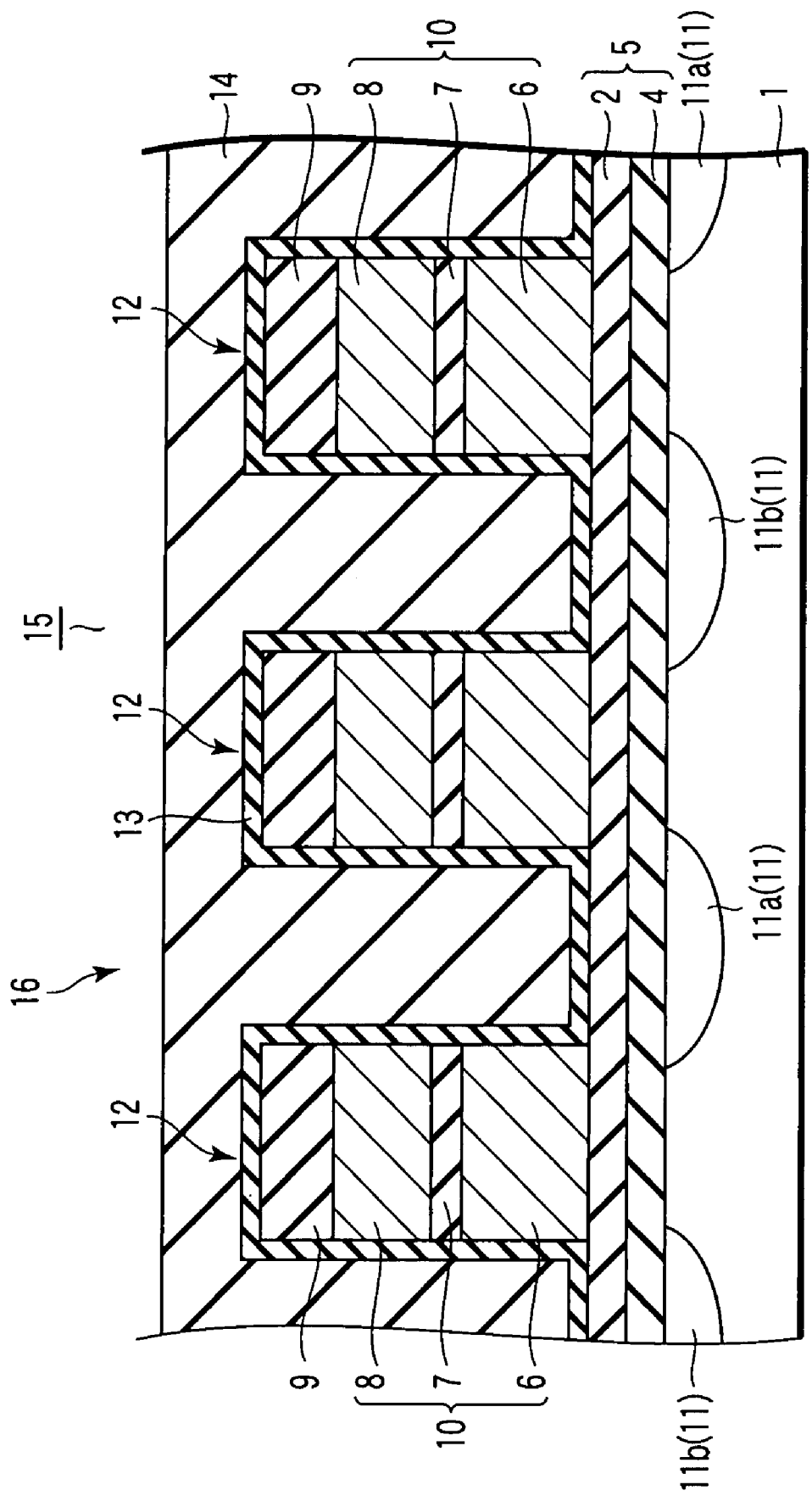
FIG. 4 is a sectional view taken along the cutting line A-A' shown in FIG. 3.
Figure 5:
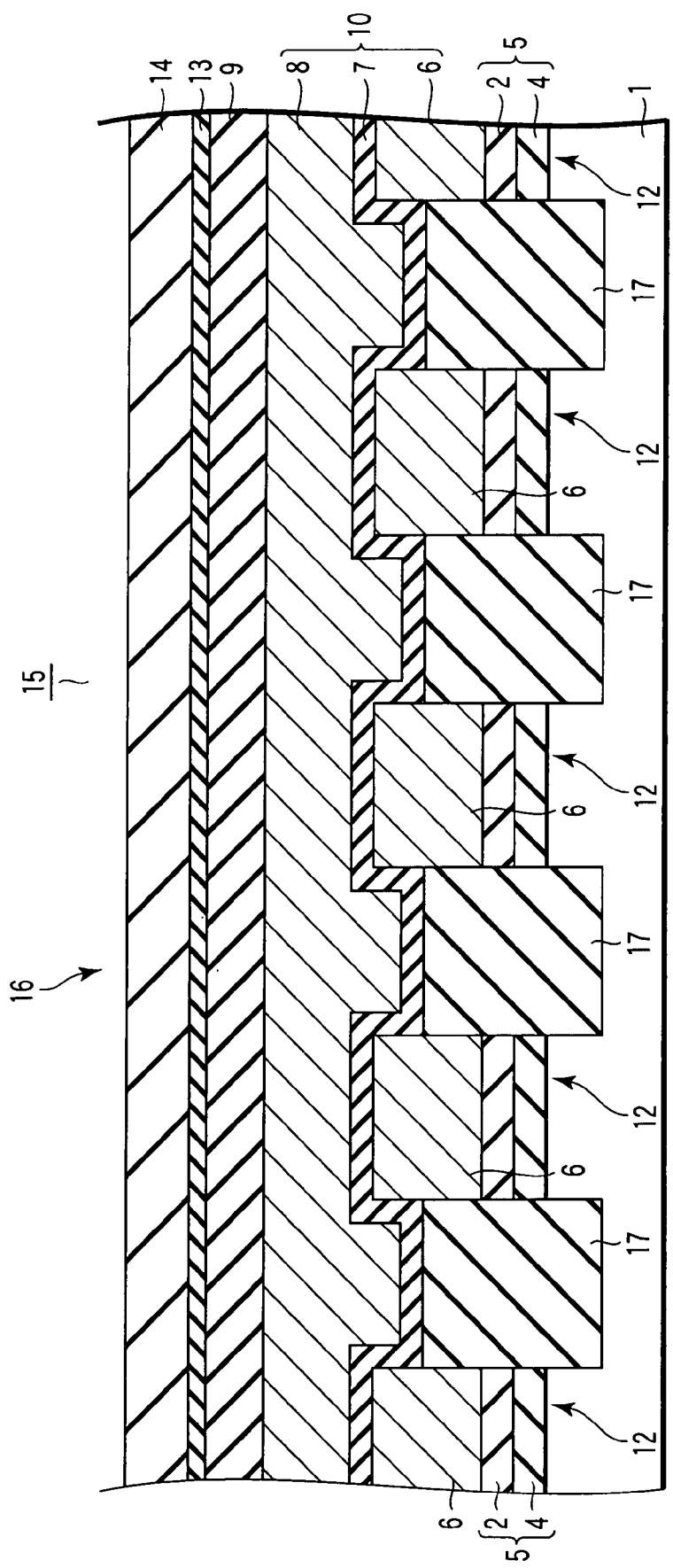
FIG. 5 is a sectional view taken along the cutting line B-B' shown in FIG. 3.
Figure 7A:
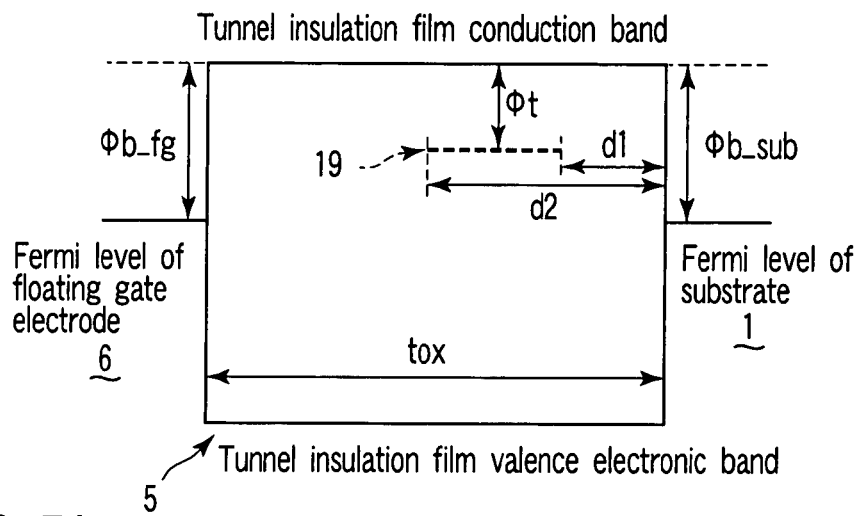
FIGS. 7A, 7B and 7C are views schematically showing an energy level and a presence range in a film thickness direction, of the tunnel insulation film possessed by the semiconductor device according to the first embodiment.
Figure 7B:
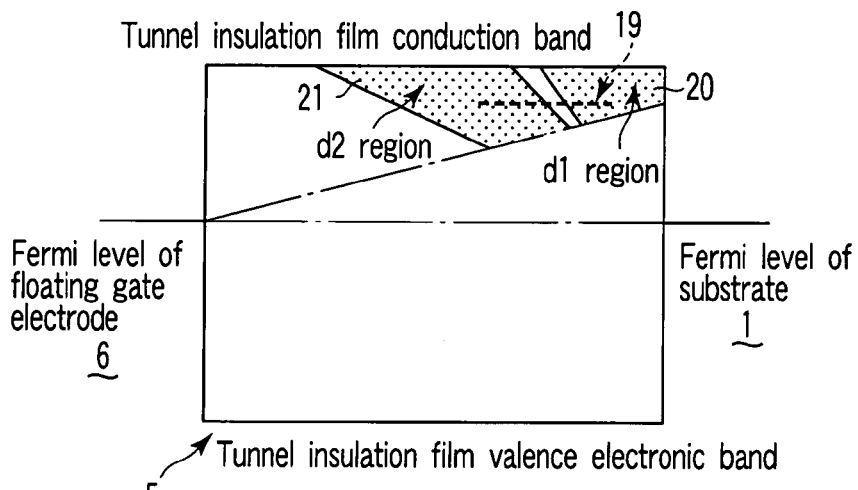
Figure 7C:
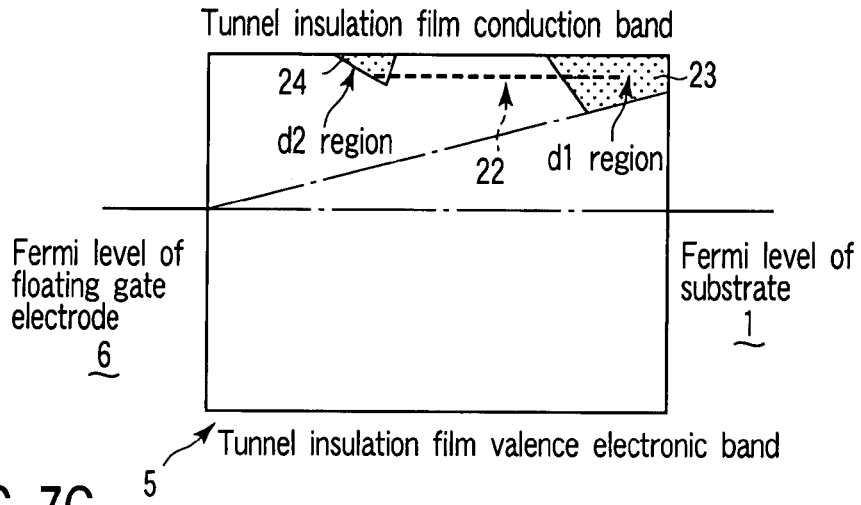

First, a first embodiment of the present invention will be described with reference to FIGS. 1A to 7C. FIGS. 1A to 2B are process cross sections showing a method for manufacturing a semiconductor device according to the first embodiment. FIG. 3 is a plan view showing a memory element forming region of the semiconductor device according to the first embodiment as seen from above thereof. FIG. 4 a sectional view taken along the cutting line A-A' shown in FIG. 3. FIG. 5 is a sectional view taken along the cutting line B-B' shown in FIG. 3. FIGS. 6A and 6B are views schematically showing an energy band diagram of a tunnel insulation film of the semiconductor device according to the first embodiment. FIGS. 7A to 7C are views schematically showing an energy level and a presence range in a film thickness direction, of the tunnel insulation film possessed by the semiconductor device according to the first embodiment.

In the present embodiment, of memory type semiconductor devices serving as semiconductor devices, a description will be given with respect to a nonvolatile memory equipped with a tunnel insulation film having a charge injection assist level and a method for manufacturing the nonvolatile memory. In particular, a description will be given with respect to a structure of a tunnel insulation film for use in a flash memory that is one type of nonvolatile memory, the tunnel insulation film having its improved electrical characteristics; and a method for manufacturing the tunnel insulation film. Now, a detailed description will be given below.

First, with reference to FIGS. 1A to 5, a description will be given with respect to a method for manufacturing a nonvolatile memory serving as the semiconductor apparatus according to the first embodiment.

Figure 1A:
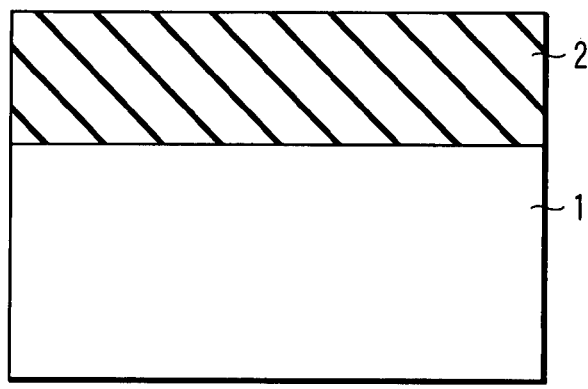
FIGS. 1A, 1B and 1C are process sectional views showing a method for manufacturing a semiconductor device according to a first embodiment.

First, as shown in FIG. 1A, a silicon oxide film ($SiO_2$ film) 2 is provided in accordance with a thermal oxidation method on the surface of a crystalline silicon substrate (silicon wafer) 1 doped with a boron element (B) and serving as a p-type semiconductor substrate. The silicon oxide film 2 is formed on the surface of the crystalline silicon substrate 1 until its film thickness has become about 8 nm. The silicon oxide film 2 forms a base of a tunnel insulation film 5 having a two-layered structure described later.

Figure 1B:
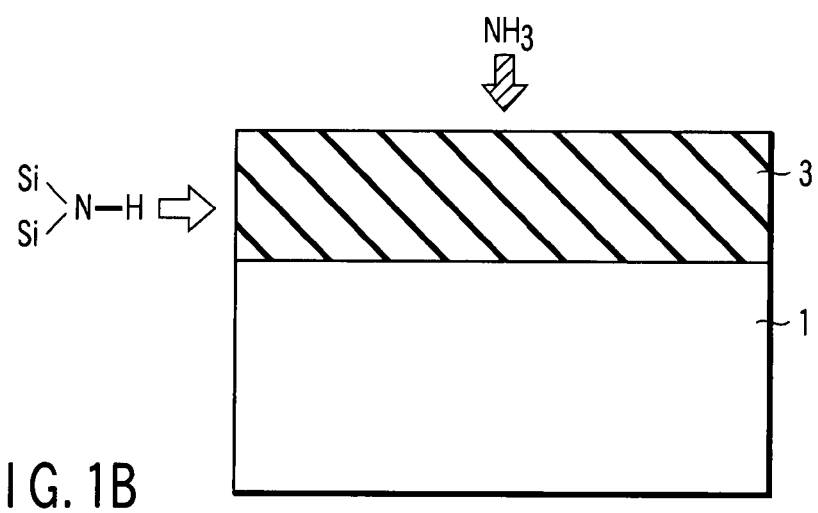

Next, as indicated by the shaded arrow shown in FIG. 1B, thermal nitridation treatment using an ammonia gas ($NH_3$) is applied to the silicon oxide film 2, and a nitrogen element (N) is introduced into the silicon oxide film 2. A temperature of the thermal nitridation treatment is typically on the order of about 600° C. to about 1,200° C. Specifically, as indicated by the hollow arrow shown in FIG. 1B, a nitrogen element (N) coupled with two silicon elements (Si) and one hydrogen element (H) represented by chemical formula (I) is introduced into the silicon oxide film 2. In this manner, the silicon oxide film 2 is obtained as a silicon oxynitride film 3.

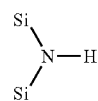

(1)

Figure 1C:
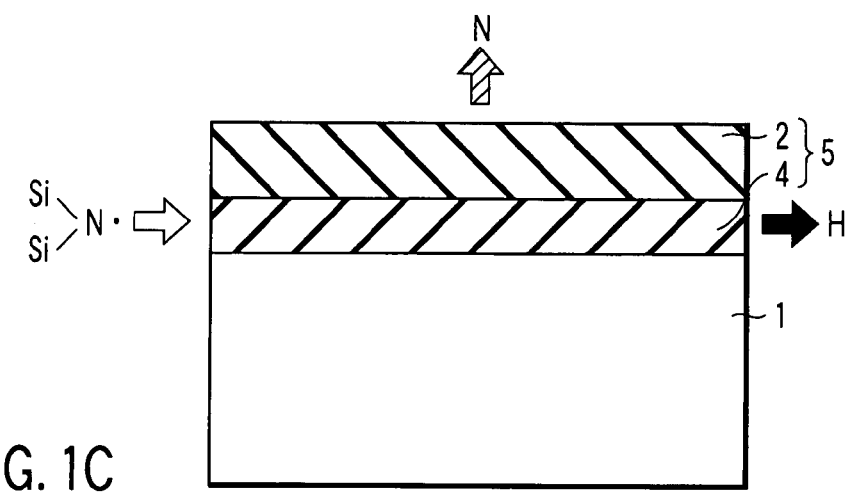

Next, as shown in FIG. 1C, thermal oxidation treatment is applied under an atmosphere in which an oxygen radical is included in the silicon oxynitride film 3. A temperature of the thermal oxidation treatment is typically on the order of about 600° C. to about 1,200° C. In this manner, an upper side and a lower side of the silicon oxynitride film 3 are remodeled to have different film properties. Specifically, radical thermal oxidation treatment is applied to the silicon oxynitride film 3 to dissociate a hydrogen element from the vicinity of an interface of the silicon oxynitride film 3 with the surface of the crystalline silicon substrate 1, as indicated by the shaded arrow shown in FIG. 1C. It is thought that the dissociation of the hydrogen element mainly occurs due to an effect of a high temperature heat treatment. In this manner, the nitrogen compound represented by chemical formula (1), having been introduced into the vicinity of the interface of the silicon oxynitride film 3 with the surface of the crystalline silicon substrate 1 is converted into that represented by chemical formula (2) in accordance with radical thermal oxidation treatment. That is, as indicated by the hollow arrow shown in FIG. 1C, a nitrogen element (N.) having one uncoupled bond and represented by chemical formula (2) is substantially introduced into the vicinity of the interface of the silicon oxynitride film 3 with the surface of the crystalline silicon substrate 1. The uncoupled bond (N.) generated in a lower region 4 of the silicon oxynitride film 3 functions as charge trap states whose energy levels are shallow (that is, near the conduction band edge of the oxynitride film).

(2)

According to the experiment conducted by the inventors, it was found that the energy level of the uncoupled bond (N.) of nitrogen generated in the lower region 4 of the silicon oxynitride film 3 was as deep as on the order of about 1 eV from a conduction band edge of the silicon oxide film 2. In addition, it was found that the hydrogen element having one uncoupled bond was generated in the region 4 of the silicon oxynitride film 3 up to the order of about 3 nm from the interface with the surface of the crystalline silicon substrate. That is, it was found that the nitrogen element having one uncoupled bond was generated in the region 4 that is about half of the side of the crystalline silicon substrate 1 in the silicon oxynitride film 3. In the following description, in the silicon oxynitride film 3, the region 4 being substantially in the lower half, generated with the nitrogen element having one uncoupled bond, is referred to as a lower region (lower layer portion).

In contrast, from the inside of a region being substantially the upper half of the silicon oxynitride film 3, which does not come into contact with the surface of the crystalline silicon substrate 1, a nitrogen element and a hydrogen element are dissociated in accordance with radical thermal oxidation treatment, as indicated by the shaded arrow shown in FIG. 1C. It is though that the dissociation of the nitrogen element and the hydrogen element occurs due to a synergetic effect between radical oxidization and high temperature annealing. In this manner, in the region being substantially in the upper half of the silicon oxynitride film 3, an oxidizing reaction advances inside thereof to form the silicon oxide film 2. In the following description, a region being substantially in the upper half of the silicon oxynitride film 3, which is remodeled to the silicon oxide film 2, is referred to as an upper region (upper layer portion). In this way, ammonia thermal nitridation treatment and radical thermal oxidation treatment are continuously applied to the silicon oxide film 2 provided on the surface of the crystalline silicon substrate 1, whereby the tunnel insulation film 5 of a two-layered structure, composed of the lower region 4 and the upper region 2 whose film properties are different from each other, can be formed on the surface of the crystalline silicon substrate 1. In addition, a clear interface may not always exist between the lower region 4 and upper region 2 of the tunnel insulation film 5.

Figure 2A:
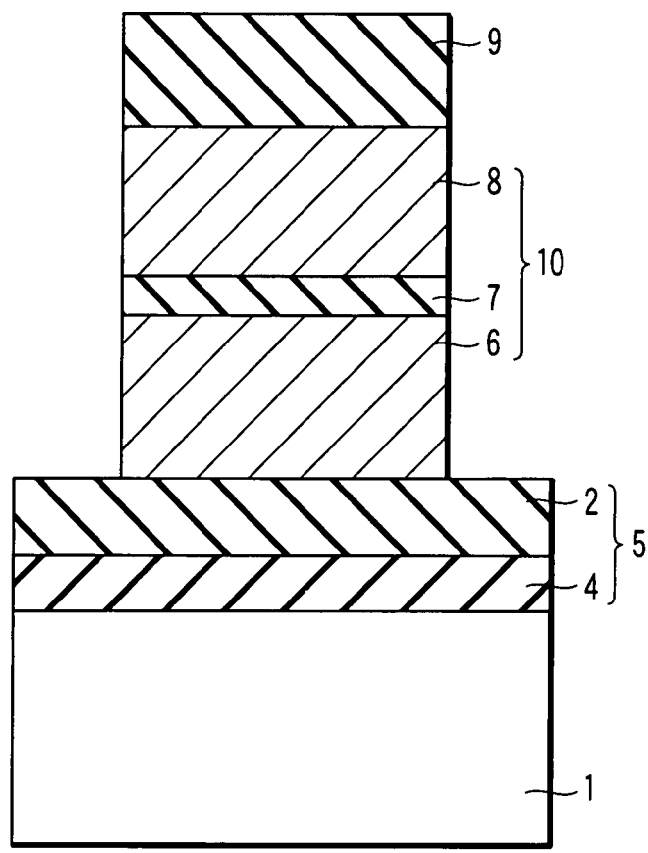
FIGS. 2A and 2B are process sectional views showing the method for manufacturing the semiconductor device according to the first embodiment.

Next, as shown in FIG. 2A, a charge storage layer 6, an inter-electrode insulation film 7, a control gate electrode 8, and a mask layer (mask material) 9 are provided in a stacking manner on the tunnel insulation film 5 by use of a well known CVD method, a lithography technique, and other various other treatment techniques. The charge storage film 6 is obtained as a so-called floating gate electrode. The floating gate electrode 6 is composed of a phosphor (P)-doped n-type polycrystalline silicon film whose thickness is on the order of about 50 nm. A stacking structure 10 including the floating gate electrode 6, the inter-electrode insulation film 7, and the control gate electrode 8 is referred to as a stacked gate structure.

Figure 2B:
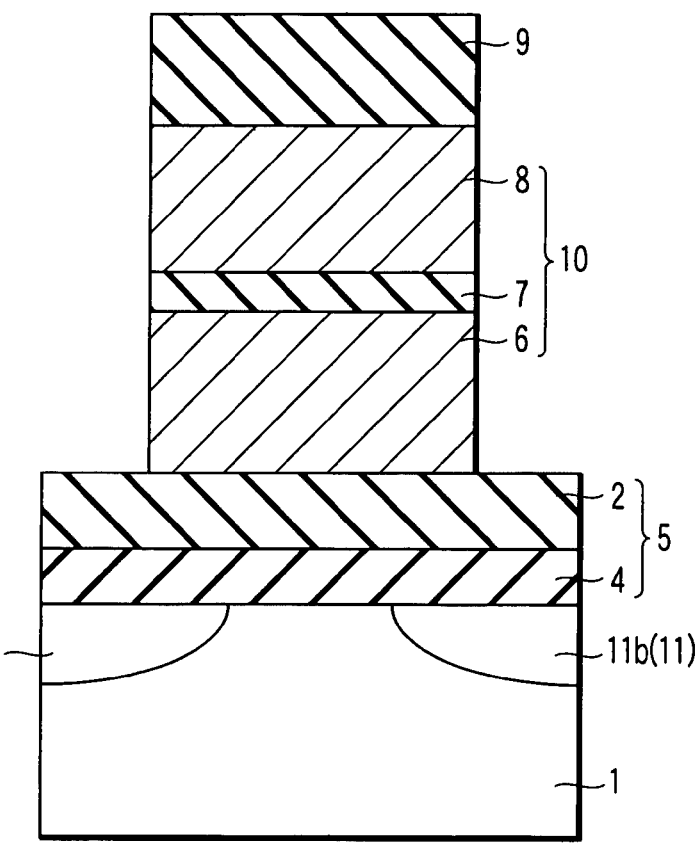

Next, as shown in FIG. 2B, an arsenic element (As) is introduced into the top layer portion of the crystalline silicon substrate 1 by using a well known ion injection technique to form a pair of n-type impurity diffusion layers 11. The pair of n-type impurity diffusion layers 11 function as a so-called charge supply layer. To the floating gate electrode 6, charges are supplied (charged) from the pair of impurity diffusion layers 11 and the surface of the crystalline silicon substrate 1 via the tunnel insulation film 5. These impurity diffusion layers 11 each are formed in a region in which the stacked gate structure 10 is located in the middle of them with the stacked gate structure 10 being masked. Specifically, one of the impurity diffusion layers 11 serves as a source region 11a, and the other one serves as a drain region 11b. The process described above is performed to form essential portions of the memory cells 12 that serve as memory elements of the memory type semiconductor device 15 according to the present embodiment. In FIGS. 2B and 4 to which reference is made later, although not shown, a channel region formed at the top layer portion between the source region 11a and the drain region 11b also functions as part of the charge supply layer at the time of data writing into the memory cells 12.

In FIGS. 2A and 2B, the tunnel insulation film 5 is provided over the entire surface of the crystalline silicon substrate 1 without being limited thereto. An advantageous effect similar to that according to the embodiment can be obtained as long as the tunnel insulation film 5 is provided at least in a lower region of the floating gate electrode 6. Further, there may be a memory element structure in which the tunnel insulation film 5 has been provided only on part of the lower region of the flowing gate electrode 6. In addition, in the present embodiment, the impurity diffusion layer 11 is formed as a charge supply layer without being limited thereto. For example, a metal layer, a metal silicide layer and the like may be formed. Furthermore, in the present embodiment, the charge storage layer 6 is provided at the intermediate portion of the pair of charge supply layers 11 without being limited thereto. The charge supply layer may be provided on one side or may be provided at on a part of the lower region of the charge storage layer 6.

Next, as shown in FIGS. 4 and 5, a gate sidewall insulation film 13 is provided by covering the surface of each of the stacked gate structure 10, the mask layer 9, and the tunnel insulation film 5 (silicon oxide film 2) exposed from the stacked gate structure 10. Subsequently, an inter-layered insulation film 14 is provided by covering the gate sidewall insulation film 13. Although a specific and detailed description together with illustration is omitted here, a desired semiconductor device 15 is obtained through a predetermined process such as a wiring forming process. That is, there is obtained a flash memory 15 equipped with a tunnel insulation film 5 having a two-layered structure in which film qualities differ between the upper and lower layers 2 and 4, and charge trap states whose energy levels are lower than that in another region are provided in the vicinity of an interface with the surface of the crystalline silicon substrate 1 (in the vicinity of an interface at the side of charge injection). For ease of explanation, FIGS. 1A to 2B show one memory cell 12 and a structure in the vicinity thereof among a plurality of memory elements (memory cells) 12 of the flash memory 15.

FIG. 4 is a sectional view taken along the line A-A' shown in FIG. 3. That is, FIG. 4 is a sectional view taken along a direction in which a bit line (not shown) of the flash memory 15 extends. FIG. 5 is a sectional view taken along the line B-B' shown in FIG. 3. That is, FIG. 5 is a sectional view taken along a direction of extension of the control gate electrode 8 serving as a word line of the flash memory 15. FIG. 3 is a plan view showing a memory element forming region 16 of the flash memory 15 as seen from above thereof. As shown in FIG. 5, floating gate electrodes 6 each are electrically separated from other adjacent floating gate electrodes 6 by means of a plurality of element isolation regions 17 provided at the top layer portion of the crystalline silicon substrate 1.

Now, with reference to FIGS. 6A and 6B, a description will be given with respect to an energy band diagram of the tunnel insulation film 5 possessed by the flash memory 15, the structure having been investigated by the inventors. FIGS. 6A and 6B are views schematically showing an energy band diagram of the tunnel insulation film 5.

First, a description will be given with respect to a case of reading data from each of the memory cells 12 of the flash memory 15 or maintaining data. In this case, a weak electric field equal to or smaller than about 5 MV/cm is applied to the tunnel insulation film 5. It has been found that the energy band of the tunnel insulation film 5 forms a structure as sown in FIG. 6A. FIG. 6A shows a data read state of each of the memory cells 12 or a data retention state of data erasure cells. In such an energy band diagram, charges 18 to be supplied via the tunnel insulation film 5 from the crystalline silicon substrate 1 and the impurity diffusion layer 11 into the floating gate electrode (phosphorus-doped polycrystalline silicon film) 6 pass through a pathway indicated by the dashed arrow shown in FIG. 6A. In this case, the charges 18 are not captured by means of charge trap states 19 with shallow energy levels generated in the lower region 4 of the tunnel insulation film 5. In this way, it has been found that, in the case where a weak electric field equal to or smaller than about 5 MV/cm is applied to the tunnel insulation film 5, the charge trap states 19 are not involved in electrical conduction of the tunnel insulation film 5.

In conclusion, in the flash memory 15 equipped with the tunnel insulation film 5, there hardly occurred a data retention failure such as mistaken data rewriting at the time of maintaining data in each of the memory cells for a long period of time. Similarly, there also hardly occurred a data reading failure such as rewriting of data in another memory cell at the time of reading data from each of the memory cells 12. That is, the flash memory 15 according to the embodiment hardly caused a malfunction of each of the memory cells (memory devices) 12 at the time of data storage or at the time of data reading.

Now, a description will be given with respect to a case of writing data into each of the memory cells 12 of the flash memory 15. In this case, a strong electric field equal to or greater than about 10 MV/cm is applied to the tunnel insulation film 5. It has been found that an energy band of the tunnel insulation film 5 is obtained as a structure as shown in FIG. 6B. In such an energy band diagram, the charges 18 to be supplied into the floating gate electrode 6 from the channel region and the impurity diffusion layer 11 formed at the top layer portion of the crystalline silicon substrate 1 via the tunnel insulation film 5 passes along a pathway indicated by the solid arrow shown in FIG. 6A. In this case, the charges 18 is temporarily captured by the charge trap states 19 having shallow energy levels generated in the lower region 4 of the tunnel insulation film 5 in the course of its movement. Then, the charges 18 moves toward the inside of the floating gate electrode 6 from the charge trap states 19 having the shallow energy levels. In this way, in the case where a strong electric field equal to or greater than about 10 MV/cm is applied to the tunnel insulation film 5, a two-staged (two-stepped) tunnel current via the charge trap states 19 having shallow energy levels flows between the crystalline silicon substrate 1 and the floating gate electrode 6, and thus, it has been found that the tunnel efficiency is significantly improved. The charge trap states 19 having such a function can be referred to as charge injection assist levels.

Up to now, a description has been given with respect to a method for improving the tunnel efficiency at the time of writing data into each of the memory cells 12. In contrast, in order to improve the tunnel efficiency at the time of data erasure in each of the memory cells 12, it suffices that the charge trap states having shallow energy levels are formed in the upper region 2 of the tunnel insulation film 5. Specifically, although not shown, a lower layered silicon oxide film is first formed on the surface of the crystalline silicon substrate 1 in accordance with a thermal oxidization method. Subsequently, an upper layered silicon nitride film is formed on the lower layered silicon oxide film in accordance with a CVD method using a raw material gas containing ammonia and silicon. Then, a high temperature heat treatment on the order of about 600° C. to 1,200° C. is applied to the upper layered silicon nitride film, thereby dissociating a hydrogen element contained in the upper layered silicon nitride film. In this manner, the charge trap states having shallow energy levels can be formed in the upper region 2 of the tunnel insulation film 5. Consequently, the tunnel efficiency at the time of data erasure in each of the memory cells 12 can be improved.

It has been found that, in the tunnel insulation layer 5 according to the embodiment, as compared with a conventional tunnel insulation film (not shown), the tunnel efficiency at the time of writing data into each memory cell 12 or erasing data contained in each memory cell 12 is significantly improved. According to the experiment executed by the inventors, it has been found that the tunnel insulation film 5 of the embodiment having the charge injection assist levels 19 can obtain a tunnel current of a flow rate that is about 100 times at an equal voltage as compared with the conventional tunnel insulation film (not shown) at the time of writing data into each memory cell 12 or erasing the data contained in each memory cell 12. That is, it has been found that the flash memory 15 of the embodiment can speed up the data writing operation or data erase operation. In addition, it has been found that the flash memory 15 can achieve a low operation voltage in the data writing operation or erase operation.

Now, with reference to FIGS. 7A, 7B and 7C, a description will be given with respect to a presence range of the charge trap states contained in the tunnel insulation film 5 provided in the flash memory 15, the presence range having been investigated by the inventors. Specifically, a description will be given with respect to ranges of an energy depth $\Phi t$ of the charge trap states 19 in the tunnel insulation film 5 that the advantageous effect as described previously can be obtained, and of a distance "d" of the charge trap states 19 from an interface between the crystalline silicon substrate 1 and the tunnel insulation film 5. FIGS. 7A, 7B and 7C are views schematically showing a presence range of the charge trap states 19 in the tunnel insulation film 5.

First, as shown in FIG. 7A, the film thickness of the tunnel insulation film 5 is defined as $t_{OX}$. An energy difference between a conduction band edge of the tunnel insulation film 5 and a Fermi level of the crystalline silicon substrate 1 is defined as $\Phi b\_sub$. An energy difference between the conduction band edge of the tunnel insulation film 5 and a Fermi level of the floating gate electrode 6 is defined as $\Phi b\_fg$. An energy difference between the conduction band edge of the tunnel insulation film 5 and the charge trap states 19 are defined as $\Phi t$. The shortest distance between the charge trap states 19 and the crystalline silicon substrate 1 is defined as d1. Further, the longest distance between the charge trap states 19 and the crystalline silicon substrate 1 is defined as d2. In order to obtain the above-described advantageous effect under such settings, the depth $\Phi t$ of the charge trap states 19 and the distances d1 and d2 of the charge trap states 19 from the interface between the crystalline silicon substrate 1 and the tunnel insulation film 5 are set so as to satisfy conditions described below.

First, in order to improve the tunnel efficiency of a tunnel current that flows in the tunnel insulation film 5 at the time of writing data into each memory cell 12 of the flash memory 15, it suffices that $\Phi t$, d1 and d2 are set so as to satisfy the following formulas (1) and (2). In formula (1), Ewrit_max represents the maximum value of an electric field to be applied to the tunnel insulation film 5 at the time of data writing. In formula (2), Ewrite_min represents the minimum value of an electric field to be applied to the tunnel insulation film 5 at the time of data writing. Further, in formulas (1) and (2), "e" represents a charge element quantity.

$$e \times d1 \times E\text{write\_max} + \Phi t < \Phi b\_sub \quad (1)$$

$$e \times d2 \times E\text{write\_min} + \Phi t > \Phi b\_sub \quad (2)$$

Next, in order to avoid increasing of a leak current of a tunnel current that flows in the tunnel insulation film 5 at the time of reading data into each memory cell 12, it suffices that $\Phi t$ and d2 are set so as to satisfy the following formula (3). In formula (3), Eread represents a value of an electric field to be applied to the tunnel insulation film 5 at the time of data reading.

$$e \times d2 \times E\text{read} + \Phi t < \Phi b\_sub \quad (3)$$

In order to avoid increase of a leak current of a tunnel current that flows in the tunnel insulation film 5 at the time of maintaining data contained in the memory cell(s) 12 that function as data write cell(s) among the memory cells 12 possessed by the flash memory 15, it suffices that $\Phi t$ and d1 are set so as to satisfy the following formula (4). In formula (4), Eret_w represents a value of a self-electric field produced in the tunnel insulation film 5 at the time of data retention of the data write cells.

$$e \times (t_{ox} - d1) \times E\text{ret\_w} + \Phi t < \Phi b\_fg \quad (4)$$

Next, in order to avoid an increase of a leak current of a tunnel current that flows in the tunnel insulation film 5 at the time of maintaining data contained in the memory cell(s) 12 that function as data erasure cell(s) among the memory cells 12 of the flash memory 15, it suffices that $\Phi t$ and d2 are set so as to satisfy the following formula (5). In formula (5), Eret_e represents a value of the electric field produced in the tunnel insulation film 5 at the time of data retention of data erasure cells.

$$e \times d2 \times E\text{ret\_e} + \Phi t < \Phi b\_sub \quad (5)$$

A limitation range of each of the energy depth $\Phi t$ of the charge trap states 19 and of the distances d1 and d2 of the charge trap states 19 are obtained as the range shown in FIG. 7. That is, in order to attain the advantageous effect of a fast data write operation and voltage lowering of the write operation voltage, it suffices that the charge trap states 19 are distributed in the film thickness direction of the tunnel insulation film 5 such that a portion closest to the substrate 1 is located in a band region (d1 region) 20 indicated by the dot portion shown in FIG. 7B. In addition, it suffices that the charge trap states 19 are provided such that the most distant portion from the substrate 1 is located in a band region (d2 region) 21 indicated by the shaded portion shown in FIG. 7b. In this way, the charge trap states 19 are provided from the d1 region 20 across the d2 region 21, whereby the flash memory 15 according to the present embodiment can attain the remarkably advantageous effect described previously over a conventional flash memory (not shown).

As a result of investigation by the inventors, the energy difference $\Phi b\_sub$ between the conduction band edge of the tunnel insulation film 5 and the Fermi level of the crystalline silicon substrate 1 was about 3.2 eV. In addition, an energy difference between the conduction band edge of the tunnel insulation film 5 and a valence band edge of the tunnel insulation film 5 was about 8 eV to 9 eV.

Although FIG. 7B shows a case in which a plurality of charge trap states whose energy depth $\Phi t$ are constant are provided, the charge trap states are not limited thereto. With respect to the charge trap states, the energy depth $\Phi t$ of a level may change as long as the trap states are provided from the d1 region 20 across the d2 region 21.

Further, with reference to FIG. 7C, a description will be given with respect to a range of an energy depth $\Phi t$ of charge trap states 22 in the tunnel insulation film 5 that can achieve high speed data write operation and erase operation and low operating voltages thereof; and of each of distances d1 and d2 of the charge trap states 22 from the interface between the crystalline silicon substrate 1 and the tunnel insulation film 5. FIG. 7C is a view schematically showing a presence range of the charge trap states 22 in the tunnel insulation film 5.

In order to improve the tunnel efficiency of a tunnel current that flows in the tunnel insulation film 5 at the time of erasing data contained in each of the memory cells 12 of the flash memory 15, it suffices that $\Phi t$, d1 and d2 are set so as to satisfy the following formulas (6) and (7). In formula (6), Eerase_max represents the maximum value of an electric field to be applied to the tunnel insulation film 5 at the time of data erasure. In formula (7), Eerase_min represents the minimum value of an electric field to be applied to the tunnel insulation film 5 at the time of data erasure. Other parameters are similar to those in the formulas (1) to (5) according to the first embodiment.

$$e \times (t_{ox} - d2) \times E\text{rase\_max} + \Phi t < \Phi b\_fg \quad (6)$$

$$e \times (t_{ox} - d1) \times E\text{erase\_min} + \Phi t > b\_fg \quad (7)$$

A limitation range of each of the energy depth $\Phi t$ of the charge trap states 22 described and the distances d1 and d2 of the charge trap states 22 described above is obtained as the range shown in FIG. 7C. That is, in order to attain an advantageous effect of a high speed data write operation and erase operation and a low operating voltage thereof, it suffices that the charge trap states 22 are distributed in the film thickness direction of the tunnel insulation film 5 such that a portion closest to the substrate is located in a band region (d1 region) 23 indicated by the dot portion shown in FIG. 7C. In addition, it suffices that the charge trap states 22 are provided such that the most distant portion from the substrate is located in a band region (d2 region) 24 indicated by the shaded portion shown in FIG. 7C. In this way, the charge trap states 22 are provided from the d1 region 23 across the d2 region 24, whereby the flash memory 15 according to the present embodiment can attain the remarkably advantageous effect described previously over the conventional flash memory (not shown).

Although FIG. 7C shows a case in which a plurality of charge trap states whose energy depth Φt are constant is provided, the charge trap states are not limited thereto. With respect to the charge trap states, the energy depth Φt of a level may change as long as the trap levels are provided from the d1 region 23 across the d2 region 24.

As has been described above, in the first embodiment, the ammonia thermal nitridation treatment and the radical thermal oxidation treatment are continuously applied to the silicon oxide film 2 provided on the surface of the crystalline silicon substrate 1 that forms a base of the tunnel insulation film 5. In this manner, the tunnel insulation film 5 of a two-layered structure composed of the lower region 4 and the upper region 2 whose film qualities are different from each other is formed on the surface of the crystalline silicon substrate 1. At this time, a substrate shown in chemical formula (1), having been introduced into the lower region 4 of the tunnel insulation film 5 in accordance with the ammonia thermal nitridation treatment is hydrogen-dissociated in accordance with radical thermal oxidation treatment to be converted into a substance shown in chemical formula (2). As a result, the charge trap states 19 having shallow energy levels are provided in the vicinity of the interface between the tunnel insulation film 5 and the crystalline silicon substrate 1 that is in the vicinity of the interface of the tunnel insulation film 5 at the side of the charge injection. That is, the charge trap states 19 at which an electron potential energy is higher than a Fermi level of the crystalline silicon substrate 1 is provided in the vicinity of the interface of the tunnel insulation film 5 with the crystalline silicon substrate 1.

In the flash memory 15 equipped with the tunnel insulation film 5 having such a structure, the tunnel efficiency at the time of applying a high electric field is significantly improved, thereby making it possible to achieve a fast write operation speed and erase operation speed of each memory cell (memory device) 12. It is also possible to achieve voltage lowering of the write operation voltage and erase operation voltage of each memory cell 12. Further, a leak current hardly flows in the tunnel insulation film 5 at the time of applying a low voltage when each memory cell 12 is caused to make a data read operation or maintain data, thus making it possible to avoid an incorrect operation of each memory cell 12. In this manner, performance, quality, reliability, yield and the like of the flash memory 15 according to the embodiment are improved as compared with the conventional flash memory.

Consequently, the first embodiment can provide a flash memory 15 having a tunnel insulation film 5 in which a tunnel current hardly flows in a low electric field and a tunnel current easily flows in a high electric field, the flash memory comprising a plurality of memory cells 12 having improved electronic characteristics. It is also possible to provide a method for manufacturing a flash memory 15, capable of easily manufacturing such a flash memory 15.

Second Embodiment

Figure 12:
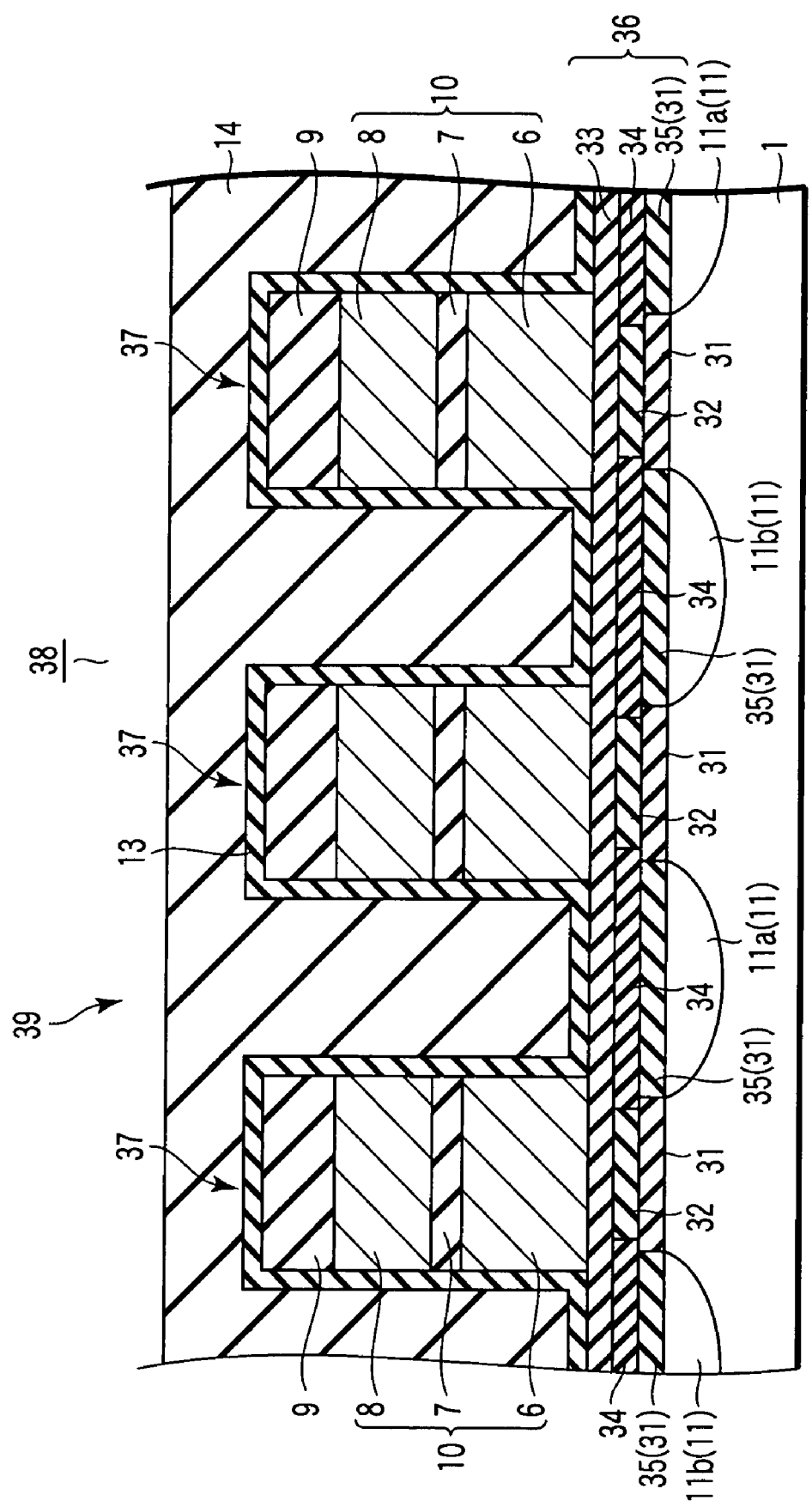
FIG. 12 is a sectional view taken along the cutting line C-C' shown in FIG. 11.
Figure 13:
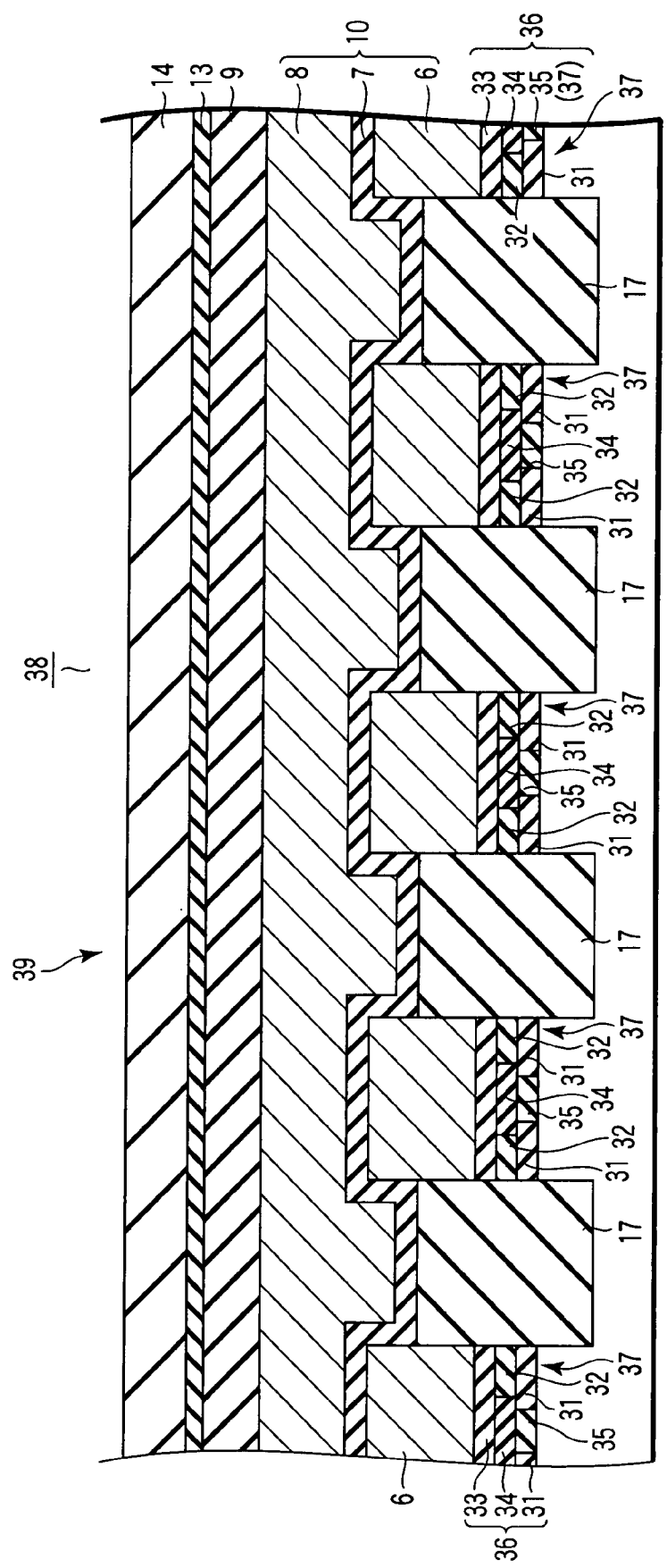
FIG. 13 is a sectional view taken along the cutting line D-D' shown in FIG. 11.

Now, a second embodiment according to the invention will be described with reference to FIGS. 8A to 14. FIGS. 8A to 10 are process sectional sections showing a method for manufacturing a semiconductor device according to the second embodiment. FIG. 11 is a plan view showing a memory element forming region of the semiconductor device according to the invention as seen from above thereof. FIG. 12 is a sectional view taken along the cutting line C-C' shown in FIG. 11. FIG. 13 is a sectional view taken along the line D-D' shown in FIG. 11. FIG. 14A is a sectional view showing a spatial distribution of charge trap states of a tunnel insulation film possessed by the semiconductor device according to the second embodiment. FIG. 14B is a sectional view showing a spatial distribution of charge trap states of a tunnel insulation film possessed by a semiconductor device according to an example of a modified second embodiment. Like constituent elements shown in the first embodiment described previously are designated by like reference numerals, and a detailed description is omitted here.

In the second embodiment, a description will be given with respect to a case in which a technique of providing charge trap states with shallow energy levels in the tunnel insulation film described in the first embodiment is applied for a flash memory (nonvolatile memory) that makes a write operation and an erasure operation by use of a tunnel current. Specifically, a description will be given with respect to a technique of individually forming charge trap states that contributes to a write operation and charge trap states that contributes to an erase operation in different regions in a tunnel insulation film. A detailed description will be given below.

First, with reference to FIGS. 8A to 13, a description will be given with respect to a method for manufacturing a non-volatile memory as a semiconductor device according to the embodiment.

First, as shown in FIG. 8A, a lower layered silicon oxide film 31, a silicon nitride film 32, and an upper layered silicon oxide film 33 are sequentially deposited on the surface of a crystalline silicon substrate 1 in accordance with a CVD method. At this time, the lower layer silicon oxide film 31 and the upper layered silicon oxide film 33 are formed until their film thicknesses become about 3 nm. In addition, the silicon nitride film 32 is formed until its film thickness becomes about 2 nm. These lower layer silicon oxide film 31, silicon nitride film 32, and upper layered silicon oxide film 33 stacked on the crystalline silicon substrate 1 form a base of a tunnel insulation film 36 having a three-layered structure described later. That is, the lower layer silicon oxide film 31 forms a base of a lower region (lower-layer-side tunnel insulation film) of the tunnel insulation film 36. The silicon nitride film 32 forms a base of an intermediate portion region (intermediate tunnel insulation film) of the tunnel insulation film 36. The upper layered silicon oxide film 33 forms a base of an upper region (upper-layer-side tunnel insulation film) of the tunnel insulation film 36.

In addition, at the time of forming the silicon nitride film 32, an ammonia gas is used as a nitrogen source gas in the raw material gas. As a consequence, the silicon nitride film 32 is formed as having a nitrogen element coupled with two silicon elements and one hydrogen element. After the silicon nitride film 32 has been formed in accordance with such a method, a heat treatment (high temperature annealing treatment) is applied to the silicon nitride film 32 at about 1,000° C. In this manner, as in the first embodiment, a hydrogen element is dissociated from the inside of the silicon nitride film 32, so that the charge trap states having shallow energy levels are formed in the silicon nitride film 32. A temperature of the heat treatment can be typically set in the range of about 600° C. to about 1,200° C.

Next, as shown in FIG. 8B, a stacked gate structure 10 including a floating gate electrode 6, an inter-electrode insulation film 7, and a control gate electrode 8 is provided on the upper layered silicon oxide film 33 in accordance with the same method as that in the first embodiment. In addition, a mask layer 9 is provided on the control gate electrode 8.

Next, as shown in FIG. 9A, a thermal oxidation treatment is applied in an atmosphere including an oxygen radical to the lower layered silicon oxide film 31, the silicon nitride film 32, and the upper layered silicon oxide film 33. In this manner, most of the nitrogen elements and hydrogen elements contained in the silicon nitride film 32 deviated from the lower side of the floating gate electrode 6 (stacked gate structure 10) in the silicon nitride film 32 are dissociated. As a result, the silicon nitride film 32 deviated from the lower side of the floating gate electrode 6 is remodeled to a silicon oxynitride film 34. At this time, an oxygen radial enters a region at its depth side as well as the region of the silicon nitride film 32 that is deviated from the lower side of the floating gate electrode 6. That is, the oxygen radical also enters the silicon nitride film 32 located at the lower side of both ends (edge portions) of the floating gate electrode 6 along the surface of the crystalline silicon substrate 1 in the silicon nitride film 32 located at the lower side of the floating gate electrode 6. The distance by which the oxygen radical enters can be controlled in the range on the order of about 1 nm to about 30 nm via the temperature of the thermal oxidation treatment. As a result, as shown in FIG. 9A, the silicon oxynitride film 32 located at the lower side of both ends of the floating gate electrode 6 is also remodeled to the silicon acidic nitride film 34 while most of the nitrogen elements and hydrogen elements are dissociated from its inside, as well as only the silicon nitride film 32 deviated from the lower side of the floating gate electrode 6. The silicon oxynitride film 34 configures an intermediate region (intermediate tunnel insulation film) of the tunnel insulation film 36 together with the silicon nitride film 32.

According to the result of investigation by the Inventors, it has been found that an uncoupled bond of nitrogen that exists in the silicon nitride film 32 hardly exists in the silicon oxynitride film 34. In addition, as described previously, oxidation treatment is carried out toward a region located below both the ends of the floating gate electrode 6 that is its inside from a region the silicon nitride film 32 that is deviated from the lower side of the floating gate electrode 6. The oxidation treatment is referred to as bird's beak oxidation treatment.

Next, as shown in FIG. 9B, in accordance with a method similar to that of the first embodiment, a pair of a source region 11a and a drain region 11b are formed at the top layer portion of the crystalline silicon substrate 1.

Next, as shown in FIG. 10, an ammonia thermal nitridation treatment and radical thermal oxidation treatment are sequentially applied to the lower layered silicon oxide film 31, the silicon oxynitride film 34 and the upper layered silicon oxide film 33. In this manner, in the lower layered silicon oxide film 31, charge trap states having shallow energy levels are formed in the lower layer silicon oxide film 31 that is deviated from the lower side of the floating gate electrode 6. At this time, a nitriding agent and an oxidizing agent, as in the oxygen radical described previously, enters a region at its depth side as well as the region that is deviated from the lower side of the floating gate electrode 6 of the lower layered silicon oxide film 31. That is, the nitriding agent and the oxidizing agent enters the lower layered silicon oxide film 31 located below both the ends of the floating gate electrode 6 among the lower layered silicon oxide film 31 located below the floating gate electrode 6. The distance the nitriding agent and oxidizing agent enter can be controlled in the range on the order of about 1 nm to about 20 nm via temperature control of the ammonia thermal nitridation treatment and the radical thermal oxidation treatment. Since the lower layered silicon oxide film 31 is provided at a position (lower layer side) that is deeper than the silicon nitride film 32 (silicon oxynitride film 34), the nitriding agent and the oxidizing agent hardly enter the depth side (inside) below the floating gate electrode 6 like an oxygen radial when the silicon oxynitride film 34 has been formed. As a result, in the lower layered silicon oxide film 31, the charge trap states having shallow energy levels are formed in a region that is further out than the region below the silicon nitride film 32.

In this way, a lower layer silicon oxide film 35 having charge trap states whose energy levels are shallow are formed in a region that is further out than the region below the silicon nitride film 32. In addition, the lower layered silicon oxide film 35 having charge trap states whose energy levels are shallow are formed to be separated from the silicon nitride film 32. That is, the lower layered silicon oxide film 35 having charge trap states whose energy levels are shallow, as shown in FIG. 10, is separated from the silicon nitride film 32, and is formed in a region that is further out than the lower part of both the ends of the floating gate electrode 6. The lower layered silicon oxide film 35 having charge trap states whose energy levels are shallow configures a lower region (lower layer side tunnel insulation film) of the tunnel insulation film 36 together with the lower layered silicon oxide film 31.

According to the result of investigation by the inventors, it has been found that the lower layered silicon oxide film 35 having charge trap states whose energy levels are shallow are formed approximately covering the source region 11a and the drain region 11b in the vicinity of the interface of the lower layered silicon oxide film 31 with the crystalline silicon substrate 1. In addition, as in the bird's beak oxidation treatment described previously, nitridation treatment, which is carried out, among the lower layered silicon oxide film 31, from a region that is deviated from the lower side of the floating gate electrode 6 toward a region located below both the ends of the floating gate electrode 6 that is its inside, is referred to as bird's beak nitridation treatment.

In this way, thermal oxidation treatment (bird's beak oxidation treatment) including an oxygen radical, ammonia thermal nitridation treatment (bird's beak nitridation treatment), and radical thermal oxidation treatment (bird's beak oxidation treatment) are continuously applied to the lower layered silicon oxide film 31, the silicon oxynitride film 34, and the upper layered silicon oxide film 33 provided on the surface of the crystalline silicon substrate 1, whereby a tunnel insulation film 36 having a three-layered structure can be formed on the surface of the crystalline silicon substrate 1. In accordance with the above process, as shown in FIG. 10, essential portions of memory cells 37 are formed as memory elements possessed by a memory type semiconductor device 38 according to the present embodiment.

In FIGS. 8A, 8B, 9A, 9B and 10, the tunnel insulation film 36 is fully provided on the surface of the crystalline silicon substrate 1, but not limited thereto. As long as the tunnel insulation film 36 is provided in at least a lower region of the floating gate electrode 6, advantageous effect similar to that according to the present embodiment can be attained.

Next, as shown in FIGS. 12 and 13, a gate sidewall insulation film 13 is provided while covering the surface of each of a stacked gate structure 10, a mask layer 9, and a tunnel insulation film 36 exposed from the stacked gate structure 10 in accordance with the method similar to that of the first embodiment. Subsequently, an inter-layered insulation film 14 is provided while covering the gate sidewall insulation film 13. Then, although a specific and detailed description together with illustration is omitted here, a desired semiconductor device 38 is obtained through a predetermined process such as a wiring forming process. That is, a flash memory 38 is obtained as comprising the tunnel insulation film 36 having a three-layered structure. In the tunnel insulation film, a region in which charge trap states whose energy levels are shallow have been formed at an intermediate portion in a film thickness direction and a region formed at charge trap states whose energy levels are shallow in the vicinity of the interface with the surface of the crystalline silicon substrate 1 (in the vicinity of the interface at the side of charge injection) are separated from each other to be formed at different positions. In FIGS. 8A to 10, for the sake of clarity, a structure of one memory cell 37 and its vicinity are shown among a plurality of memory cells 37 possessed by the flash memory 38.

FIG. 12 is a sectional view taken along the line C-C' shown in FIG. 11. That is, FIG. 12 is a sectional view taken along an extending direction of a bit line (not shown) of the flash memory 38. FIG. 13 is a sectional view taken along the line D-D' shown in FIG. 11. That is, FIG. 13 is a sectional view taken along an extending direction of a control gate electrode 8 that serves as a word line of the flash memory 38. FIG. 11 is a plan view showing a memory element forming region 39 of the flash memory 38 as seen from above thereof. As shown in FIG. 13, floating gate electrodes 6 are electrically isolated from other adjacent floating gate electrodes 6 by a plurality of element isolation regions 17 provided at the top layer portion of the crystalline silicon substrate 1.

Now, with reference to FIG. 14A, a description will be given with respect to a position in the tunnel insulation film 36 where charge trap states 40 whose energy levels are shallow are formed. FIG. 14A is a sectional view showing a spatial distribution of the charge trap states 40 in the tunnel insulation film 36, the sectional view being taken along the line C-C' in FIG. 11. That is, FIG. 14A is a sectional view showing a spatial distribution of the charge trap states 40 in the tunnel insulation film 36, the sectional view being taken along an extending direction of a bit line (not shown) of the flash memory 38. Therefore, the spatial distribution of the charge trap states 40 shown in FIG. 14A corresponds to a sectional structure of the flash memory 38 shown in FIG. 12.

As shown in FIG. 14A, according to a method for manufacturing the flash memory 38 of the present embodiment described previously, at the intermediate portion in the film thickness direction of the tunnel insulation film 36, charge trap states 40a (40) whose energy level are shallow are formed in a region excluding the lower part of both edges of the floating gate electrode 6 at the lower side of the float gate electrode 6.

The charge trap states 40a formed above the channel region 41 serves to flow a tunnel current at two stages (two steps) in the tunnel insulation film 36 from the floating gate electrode 6 toward the crystalline silicon substrate 1 when erasing data written into the memory cells 37. That is, the charge trap states 40a functions as charge trap states that positively contributes to an erase operation of the memory cells 37. The charge trap states 40a having such a function is also referred to as a charge ejection assist state. In general memory cells, the tunnel current at the time of data erasure flows intensively in the vicinity of both edges due to the sharp shape of both edges of the floating gate electrode. In contrast, in the present embodiment, the charge ejection assist state 40a are provided below the floating gate electrode 6, whereby the tunnel current at the time of data erasure can be efficiently flowed all over the bottom region of the floating gate electrode 6.

According to a method for manufacturing the flash memory 38 described previously, charge trap states 40b (40) whose energy levels are shallow are formed in the vicinity of the interface of the tunnel insulation film 36 with the crystalline silicon substrate 1 from the lower part of both the edges of the floating gate electrode 6 toward the outside of the lower part of the floating gate electrode 6. That is, in the vicinity of the interface of the tunnel insulation film 36 with the crystalline silicon substrate 1, the charge trap states 40b (40) whose energy levels are shallow are formed so as to cover the source region 11a and the drain region 11b.

The charge trap states 40b formed above these source region 11a and drain region 11b each serve to flow a tunnel current in two stages, as described in the first embodiment, in the tunnel insulation film 36 from the source region 11a and the drain region 11b toward the floating gate electrode 6 at the time of writing data into the memory cells 37. That is, the charge trap states 40 each function as charge trap states that positively contributes to a write operation of the memory cells 37. The charge trap states 40b having such a function is also referred to as a charge injection assist level, as described in the first embodiment. The charge injection assist levels 40b are provided above the source region 11a and the drain region 11b in which the charge density of the surface of the substrate 1 is high, whereby a tunnel current at the time of data writing can be made to flow efficiently.

A method for providing the charge ejection assist level and charge injection assist level described above in different regions of a tunnel insulation film is not limited to the structure shown in FIG. 14A. For example, as shown in FIG. 14B, the charge ejection assist level 40a and the charge injection assist level 40b may be formed in a sectional structure taken along a word line direction. FIG. 14B shows a modified example of the spatial distribution of the charge trap states 40 in the tunnel insulation film 36 shown in FIG. 14A, and corresponds to a sectional view taken along the line D-D' shown in FIG. 11. Here, the charge ejection assist levels 40a are formed at the intermediate portion in the film thickness direction of the tunnel insulation film 36 and in the lower region of both the edges of the floating gate electrode 6. In addition, the charge injection assist levels 40b are formed in the vicinity of the interface of the tunnel insulation film 36 with the crystalline silicon substrate 1 (channel region 41) and in a region other than the lower part of both the edges of the floating gate electrode 6 in the lower part of the floating gate electrode 6.

Specifically, first, a lower layered silicon nitride film having charge trap states 40b (40) whose energy levels are shallow are formed on the surface of the crystalline silicon substrate 1 in accordance with a CVD method and a high temperature heat treatment using an ammonia gas and a raw material gas containing silicon. Subsequently, an upper layer silicon oxide film is formed in accordance with a thermal oxidation method on the lower layer silicon nitride film. Subsequently, a groove for embedding the element separation insulation film 17 is formed at the top layer portion of the crystalline silicon substrate 1. Then, radical thermal oxidation treatment, ammonia thermal nitridation treatment, and thermal radical oxidation treatment are sequentially applied to the side wall portions of the element separation grooves. In this manner, the spatial distribution of the charge trap states 40b (40) whose energy levels are shallow, as shown in FIG. 14B, can be formed.

In this way, according to the method for manufacturing the flash memory 38 of the present embodiment, the charge trap states (charge ejection assist levels) 40a positively contributing to the erase operation and the charge trap states (charge injection assist levels) 40b positively contributing to the write operation can be individually produced in regions different from each other in both directions of the film thickness direction of the tunnel insulation film 36 and the facial direction of the tunnel insulation film 36. Moreover, the charge ejection assist level 40a and the charge injection assist level 40b are substantially formed to be separated from each other in a self-aligned manner.

As has been described above, according to the second embodiment, an advantageous effect similar to that of the first embodiment can be attained. In the present embodiment, as described previously, when the tunnel insulation film 36 is formed, the charge trap states whose energy levels are shallow are temporarily provided all over the region of the intermediate portion in the film thickness direction of the tunnel insulation film 36. Then, a bird's beak oxidation treatment and bird's beak nitridation treatment are applied to the tunnel insulation film 36 from both edges along the bit line direction of the memory cells 37.

In this manner, in a sectional view taken along the bit line direction shown in FIG. 14A, charge trap states whose energy levels are shallow are first ejected from the intermediate portion in the film thickness direction of the tunnel insulation film 36 and the lower side of both the edges of the memory cells 37 (floating gate electrode 6). In this manner, the charge ejection level 40a is left in a region other than the lower part of both the edges in the intermediate portion in the film thickness of the tunnel insulation film 36 and the lower part of the memory cell 37. Then, the charge injection assist levels 40b are generated in the vicinity of the interface of the tunnel insulation film 36 with the crystalline silicon substrate 1 and below both edges of the memory cell 37.

As described above, in the flash memory 38 (memory cells 37) in which both the write operation and the erase operation are made using a tunnel current, the charge ejection level 40a is formed at the intermediate portion in the film thickness direction of the tunnel insulation film 36, and the charge injection 40b is formed in the vicinity of the interface of the tunnel insulation film 36 with the crystalline silicon substrate 1, whereby the advantageous effect described below can be attained. For example, a higher write operation speed and erase operation speed of the memory cells (memory device) 37 can be achieved. In addition, further voltage lowering of a write operation voltage and an erase operation voltage of the memory cells 37 can be achieved.

In addition, the charge ejection assist levels 40a and charge injection assist levels 40b are separated from each other to be formed at different positions. This makes it possible to eliminate almost of the risk that each of the assist levels 40a and 40b is associated with the tunnel current flowing in the tunnel insulation film 36 at the time when the memory cells 37 make a read operation or maintain data. In this manner, almost all incorrect operations of the memory cells 37 in the read operation or data maintaining operation can be eliminated.

Further, by using the tunnel insulation film 36 composed of the structure shown in FIG. 14A, the write efficiency can be improved while enhancing the tunnel injection efficiency in the source region 11a and the drain region 11b which configure the impurity diffusion layer 11. Accordingly, the tunnel injection efficiency in the channel region 41 is improved. In this manner, incorrect writing in the channel region 41 at the time of making a data read operation can be restricted or reduced.

The semiconductor device and the method for manufacturing the semiconductor device according to the present invention are not limited to the first and second embodiments described previously. Part of these constituent elements or manufacturing processes may be changed in a variety of ways without deviating from the spirit of the present invention, or alternatively, a variety of variations can be implemented by appropriately or properly combining and using them.

For example, in the first embodiment, in order to form the charge trap states 19 whose energy levels are shallow in the tunnel insulation film 5, radical thermal oxidation treatment is carried out after ammonia thermal nitridation treatment has been carried out, without being limited thereto. For example, after a substance shown in chemical formula (1) has been introduced into the tunnel insulation film 5 in accordance with ammonia radial nitridation treatment, hydrogen is dissociated from this substrate in accordance with a high temperature annealing treatment, whereby the dissociated substrate may be converted into a substance shown in chemical formula (2). In accordance with such a method, as in the first embodiment, the charge trap states 19 whose energy level are shallow can be formed in the tunnel insulation film 5.

A method for forming the charge trap states 19 whose energy levels are shallow are not limited to introduction of a nitrogen uncoupled bond into the tunnel insulation film 5. For example, the charge trap states 19 whose energy levels are shallow may be formed by introducing an oxygen uncoupled bond into the tunnel insulation film 5. Alternatively, the charge trap states 19 whose energy level are shallow may be formed by introducing an impurity element in the tunnel insulation film 5, the impurity element being capable of forming the charge trap states 19 whose energy levels are shallow.

In addition, a method for forming the tunnel insulation film 5 having the charge trap states 19 whose energy levels are shallow are not limited to the method described in the first embodiment. For example, after the lower layer side tunnel insulation film 4 is formed as having the charge trap states 19 whose energy levels are shallow, a silicon oxide film or the like is deposited thereon to form an upper layer side tunnel insulation film 2, whereby the tunnel insulation film 5 having a two-layered structure may be formed.

The charge trap states 19, 40a, and 40b whose energy levels are shallow formed in the tunnel insulation films 5 and 36 in the first and second embodiments are not limited to the above-described energy levels (film thickness direction location and planar direction forming region). As long as the charge trap states 19, 40a, and 40b each are within the limitation range specified in each of the first and second embodiments, plural types of levels whose energy levels are different from each other may coexist in the tunnel insulation films 5 and 36. Consequently, the regions for forming the charge trap states 19, 40a, and 40b each can be set in the appropriate and proper range in accordance with the write property, erase property, data storage property or the like of the memory cells 12 and 37.

In each of the first and second embodiments, the semiconductor device and the method for manufacturing the semiconductor device according to the invention have been described while being limited to nonvolatile memories (flash memories) 15 and 38 comprising the floating gate electrode 6. However, the semiconductor device and a method for manufacturing the semiconductor device according to the invention are not limited to such nonvolatile memories 15 and 38. The semiconductor device and the method for manufacturing the semiconductor device according to the invention can be applied intact as long as a nonvolatile memory, in which the tunnel insulation films 5 and 36 have been provided between the charge supply layer (impurity diffusion region 11 and channel region 41) and the charge storage layer 6, is used.

Further, while the first and second embodiments each have described a case in which injection charges and ejection charges responsible for a data write operation and a data ensuring operation of the memory cells 12 and 37 are electrons, these charges are not limited thereto. Of course, an advantageous effect similar to that of each of the first and second embodiments can be attained even in the case where the Hall effect is applied as injection charges and an ejection charges responsible for the data write operation and data erase operation of the memory cells 12 and 37. In this case, the charge injection assist level and charge ejection assist level may be provided in the vicinity of a valence band of each of the tunnel insulation films 6 and 36. That is, Hall potentials may be set at a level that is higher than a Fermi level of the semiconductor substrate 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a tunnel insulation film provided on the surface of the semiconductor substrate, charge trap states at which an electron potential energy is higher than a Fermi level of the semiconductor substrate being provided at part of the tunnel insulation film at least in the vicinity of an interface with the semiconductor substrate, the charge trap states being based on uncoupled bonds of nitrogen; and
   at least one charge storage layer being provided on the tunnel insulation film, charges supplied from the semiconductor substrate via the tunnel insulation film being accumulated in the charge storage layer.

2. The device according to claim 1, wherein the charge trap states are provided in a region of a lower half of the tunnel insulation film.

3. The device according to claim 1, wherein the tunnel insulation film is formed in a two-layered structure having a lower region in which the charge trap states density are higher than that in an upper region.

4. The device according to claim 1, wherein the tunnel insulation film is formed in a two-layered structure having a lower region composed of a silicon oxynitride film, in which the charge trap states are provided, and an upper region composed of a silicon oxide film, in which the charge trap states density are lower than that in the lower region.

5. The device according to claim 1, wherein the tunnel insulation film is provided below at least part of the charge storage layer.

6. The device according to claim 1, further comprising:
   a charge supply layer provided below at least part of the charge storage layer among the top layer portion of the semiconductor substrate, the charges being supplied from the charge supply layer to the charge storage layer via the tunnel insulation film.

7. The device according to claim 6, wherein the tunnel insulation film is covering at least part of the charge supply layer in the region at least below the part of the charge storage layer.

8. The device according to claim 6, wherein the charge supply layer is composed of at least one of an impurity diffusion layer, a metal layer, and a metal silicide layer.

* * * * *